United States Patent
Sakata

(10) Patent No.: US 8,154,192 B2
(45) Date of Patent: Apr. 10, 2012

(54) LIGHTING SYSTEM

(75) Inventor: Junichiro Sakata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 697 days.

(21) Appl. No.: 11/580,200

(22) Filed: Oct. 12, 2006

(65) Prior Publication Data

US 2007/0085070 A1    Apr. 19, 2007

(30) Foreign Application Priority Data

Oct. 17, 2005    (JP) .................................. 2005-301837

(51) Int. Cl.
*H01J 63/04*    (2006.01)
*G09G 3/10*    (2006.01)

(52) U.S. Cl. ...................... 313/504; 313/506; 315/169.3

(58) Field of Classification Search .... 315/169.1–169.3, 315/291; 345/60–63, 76–77, 82–84, 89, 345/694–695; 313/500, 504, 506; 257/13
See application file for complete search history.

(56) References Cited

U.S. PATENT DOCUMENTS

| | | | |
|---|---|---|---|
| 5,837,391 A | 11/1998 | Utsugi | |
| 5,932,895 A | 8/1999 | Shen et al. | |
| 6,013,384 A | 1/2000 | Kido et al. | |
| 6,107,734 A | 8/2000 | Tanaka et al. | |
| 6,232,714 B1 * | 5/2001 | Shen et al. | 313/506 |
| 6,411,047 B1 | 6/2002 | Okazaki et al. | |
| 6,447,934 B1 | 9/2002 | Suzuki et al. | |
| 6,456,016 B1 | 9/2002 | Sundahl et al. | |
| 6,472,803 B1 * | 10/2002 | Yoshizawa et al. | 313/310 |
| 6,566,806 B1 * | 5/2003 | Kawai | 313/504 |
| 6,759,145 B2 | 7/2004 | Lin et al. | |
| 6,872,472 B2 | 3/2005 | Liao et al. | |
| 6,936,961 B2 * | 8/2005 | Liao et al. | 313/506 |
| 7,015,504 B2 | 3/2006 | Lyons et al. | |

(Continued)

FOREIGN PATENT DOCUMENTS

CN    1302011    7/2001

(Continued)

OTHER PUBLICATIONS

Kido, J. et al, "Multilayer White Light-Emitting Organic Electroluminescent Device," Science, vol. 267, Mar. 3, 1995, pp. 1332-1334.

(Continued)

*Primary Examiner* — Tung X Le
(74) *Attorney, Agent, or Firm* — Husch Blackwell LLP

(57) ABSTRACT

An object of the present invention is to provide a lighting system which uses a stacked light emitting element provided with a plurality of light emitting units and causes little change in emission color even after being used for a long time. A lighting system is provided, which includes a first light emitting element including a plurality of light emitting units; a second light emitting element; a first control means which controls light emission of the first light emitting element; and a second control means which controls light emission of the second light emitting element, where the first light emitting element emits light of a first emission color that is an initial emission color and a second emission color that is an emission color after change over time, and the second light emitting element emits light of a complementary color of the second emission color. With the above structure, color shift due to change over time can be suppressed.

20 Claims, 12 Drawing Sheets

U.S. PATENT DOCUMENTS

| | | | |
|---|---|---|---|
| 7,161,566 B2 | 1/2007 | Cok et al. | |
| 7,173,369 B2 * | 2/2007 | Forrest et al. | 313/503 |
| 7,199,521 B2 | 4/2007 | Ibe | |
| 7,227,305 B2 * | 6/2007 | Liu et al. | 313/506 |
| 7,239,081 B2 | 7/2007 | Tsutsui | |
| 7,291,969 B2 | 11/2007 | Tsutsui | |
| 7,403,177 B2 | 7/2008 | Tanada et al. | |
| 7,420,203 B2 | 9/2008 | Tsutsui et al. | |
| 7,504,049 B2 | 3/2009 | Tsutsui et al. | |
| 7,511,421 B2 | 3/2009 | Tsutsui et al. | |
| 7,535,440 B2 | 5/2009 | Nishi et al. | |
| 7,548,022 B2 * | 6/2009 | Ibe | 313/506 |
| 7,714,504 B2 * | 5/2010 | Forrest et al. | 313/504 |
| 7,772,760 B2 * | 8/2010 | Yoo et al. | 313/504 |
| 2003/0052615 A1 | 3/2003 | Lynch et al. | |
| 2003/0099860 A1 | 5/2003 | Lin et al. | |
| 2003/0127967 A1 | 7/2003 | Tsutsui et al. | |
| 2003/0170491 A1 | 9/2003 | Liao et al. | |
| 2003/0189401 A1 | 10/2003 | Kido et al. | |
| 2004/0036421 A1 * | 2/2004 | Arnold et al. | 315/169.3 |
| 2004/0066138 A1 | 4/2004 | Kanno et al. | |
| 2004/0113875 A1 * | 6/2004 | Miller et al. | 345/82 |
| 2004/0150590 A1 | 8/2004 | Cok et al. | |
| 2004/0183082 A1 | 9/2004 | Yamazaki | |
| 2004/0202893 A1 | 10/2004 | Abe | |
| 2004/0227460 A1 | 11/2004 | Liao et al. | |
| 2004/0263066 A1 | 12/2004 | Abe et al. | |
| 2005/0023536 A1 | 2/2005 | Shackle | |
| 2005/0029933 A1 | 2/2005 | Liao et al. | |
| 2005/0134174 A1 * | 6/2005 | Shiratori et al. | 313/506 |
| 2005/0156197 A1 | 7/2005 | Tsutsui et al. | |
| 2005/0212728 A1 * | 9/2005 | Miller et al. | 345/76 |
| 2006/0091797 A1 | 5/2006 | Tsutsui et al. | |
| 2007/0182318 A1 | 8/2007 | Kumaki et al. | |
| 2007/0211084 A1 | 9/2007 | Ohtani et al. | |
| 2007/0222379 A1 | 9/2007 | Yamazaki et al. | |
| 2008/0135858 A1 | 6/2008 | Yamazaki et al. | |
| 2008/0278064 A1 * | 11/2008 | Kumaki et al. | 313/504 |
| 2009/0189834 A1 * | 7/2009 | Ohshima et al. | 345/77 |

FOREIGN PATENT DOCUMENTS

| | | |
|---|---|---|
| CN | 1438828 A | 8/2003 |
| EP | 1 318 553 A2 | 6/2003 |
| EP | 1 339 112 A2 | 8/2003 |
| EP | 1 351 558 A1 | 10/2003 |
| EP | 1 443 484 A2 | 8/2004 |
| EP | 1 478 025 A2 | 11/2004 |
| JP | 6-207170 | 7/1994 |
| JP | 10-270172 | 10/1998 |
| JP | 11-329748 | 11/1999 |
| JP | 2002-260859 | 9/2002 |
| JP | 2002-278506 | 9/2002 |
| JP | 2003-45676 | 2/2003 |
| JP | 2003-187978 | 7/2003 |
| JP | 2003-264085 | 9/2003 |
| JP | 2003-272860 | 9/2003 |
| JP | 2004-6165 | 1/2004 |
| JP | 2004-327431 | 11/2004 |
| JP | 2004-327432 | 11/2004 |
| JP | 2004-342614 | 12/2004 |
| JP | 2005-183213 | 7/2005 |
| WO | WO 02/082416 | 10/2002 |

OTHER PUBLICATIONS

Kido, J. et al, "Single-layer white light-emitting organic electroluminescent devices based on dye-dispersed poly(N-vinylcarbazole)," Appl. Phys. Lett., vol. 67, No. 16, Oct. 16, 1995, pp. 2281-2283.

Hosokawa, C. et al, "31.3: Organic EL Materials Based on Styryl and Amine Derivatives," SID 01 Digest, vol. XXXII, Jun. 5-7, 2001, pp. 522-525.

Matsumoto, T. et al, "Multiphoton Emission OLED: Structure and Property," IDW '03, Proceedings of the $10^{th}$ International Display Workshops, Dec. 3-5, 2003, pp. 1285-1288.

Office Action in Chinese patent application 200610131895.8 dated Jun. 5, 2009 (with full English translation).

European Search Report re application No. EP 06021358.4, dated Jul. 2, 2009.

International Search Report re application No. PCT/JP2005/009284, dated Sep. 20, 2005.

Written Opinion of the International Searching Authority re application No. PCT/JP2005/009284, dated Sep. 20, 2005.

Hatwar, T.K. et al., "54.1: Novel Approach to Stabilize Blue OLEDS and Fabrication of High-Efficiency Tandem White OLEDS for Large-Area Display Applications," SID DIGEST '08: SID International Symposium Digest of Technical Papers, vol. 39, 2008, pp. 814-817.

Liao, L.-S. et al., "54.2: Tandem White OLEDS Combining Fluorescent and Phosphorescent Emission," SID DIGEST '08: SID International Symposium Digest of Technical Papers, vol. 39, 2008, pp. 818-821.

Kondakova, M.E. et al., "17.3: Highly Efficient Fluorescent/Phosphorescent OLED Devices Using Triplet Harvesting," SID DIGEST '08: SID International Symposium Digest of Technical Papers, vol. 39, 2008, pp. 219-222.

Office Action re Chinese application No. CN 200580016272.X, dated Jun. 6, 2008 (with English translation).

* cited by examiner

White light

Yellowish white light

White light

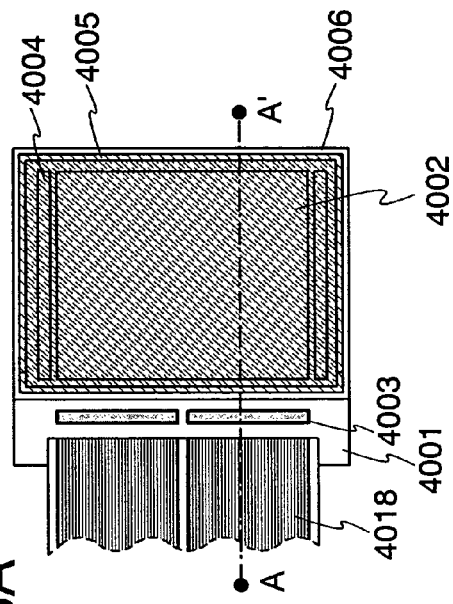
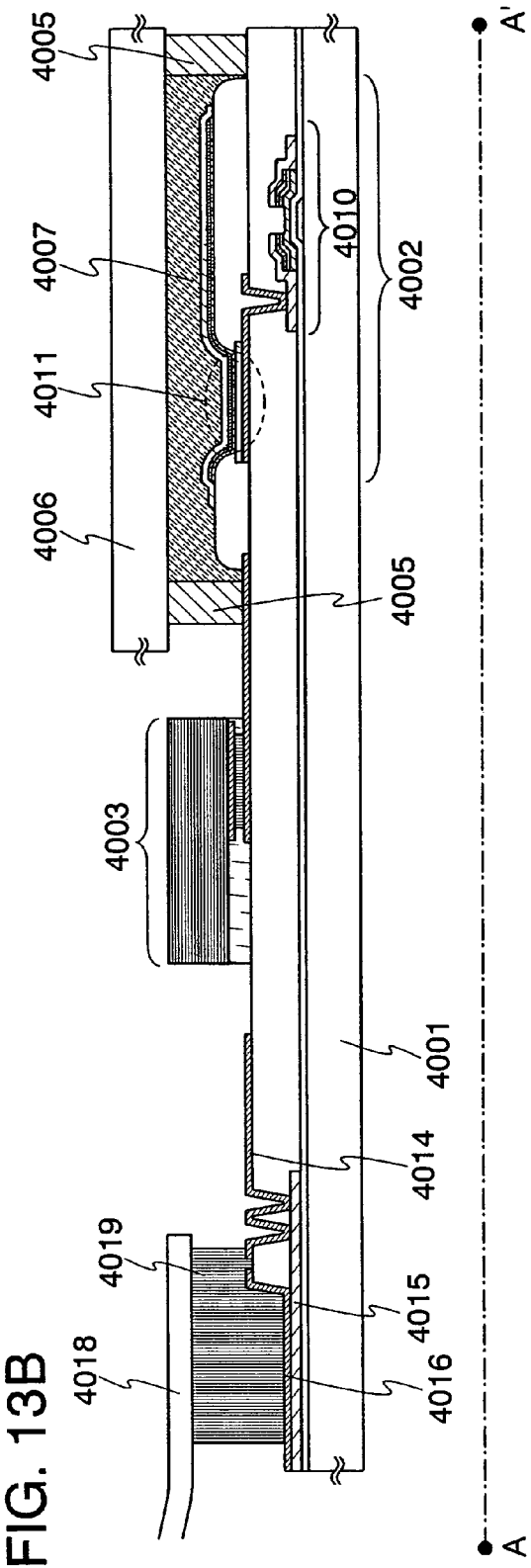
FIG. 13A
FIG. 13B

LIGHTING SYSTEM

BACKGROUND OF THE INVENTION

1. Field of the Invention

The present invention relates to a light emitting device which uses a light emitting element utilizing electroluminescence, and particularly, a lighting system.

2. Description of the Related Art

A light emitting element is a self-light emitting element and attempted to be used as a lighting system. The lighting system using the light emitting element can provide lighting systems tailored to customers' needs such as high efficiency and excellent color rendering properties.

It is said that a light emitting mechanism of the light emitting element emits light by applying a voltage between a pair of electrodes where a light emitting layer is interposed, so that electrons injected from a cathode and holes injected from an anode are recombined with each other at a light emitting center of the light emitting layer to form molecular excitons and the molecular excitons release energy when returning to a ground state. Singlet excitation and triplet excitation are known as excited states, and light emission can be achieved through either of the excited states.

As for such a light emitting element, there are many problems depending on materials in improving element characteristics, and improvement in element structure, development of materials, and the like are conducted to overcome the problems.

On the other hand, as one element structure, a light emitting element having a structure in which a plurality of light emitting units divided by charge generation layers are stacked between an anode and a cathode opposing to each other has been reported to achieve longer life when emitting light with high luminance (refer to Reference 1: Japanese Patent Laid-Open No. 2003-45676 and Reference 2: Toshio Matsumoto, Takeshi Nakada, Jun Endo, Koichi Mori, Norihumi Kawamura, Akira Tokoi, Junji Kido, IDW '03, 1285-1288). This charge generation layer needs to be formed of a material having a function to inject carriers and having an excellent light transmitting property.

In order to achieve white light emission in the structure disclosed in References 1 and 2, there are structures, for example, in which a blue light emitting unit and an orange light emitting unit are stacked as shown in FIG. 8A, and in which a blue light emitting unit, a green light emitting unit, and a red light emitting unit are stacked as shown in FIG. 8B.

However, a light emitting element provided with a plurality of light emitting units has a problem causing color shift where an emission color of the light emitting element changes as time passes unless light emitting units to be combined with each other have the same length of life. The color shift is a phenomenon in which a proportion of luminance of each light emitting unit is changed and an emission color as the light emitting element is changed. As for a decrease of luminance, constant luminance can be maintained by increasing a voltage to be applied, but color shift cannot be solved only by adjusting a voltage to be applied. For example, when the life of a blue light emitting material is shorter in FIG. 8A, an emission color gradually becomes yellowish white as shown in FIG. 8C after a certain period of time with the light emitting element lighted.

SUMMARY OF THE INVENTION

In view of the above problem, it is an object of the present invention to provide a lighting system which uses a stacked light emitting element provided with a plurality of light emitting units and causes little change in emission color even after being used for a long time.

One feature of the present invention is a lighting system including a light emitting region divided into a plurality of regions, each of the divided light emitting regions being provided with a plurality of light emitting elements, at least one of the plurality of light emitting elements being a first light emitting element including a plurality of light emitting units, at least one of the plurality of light emitting elements being a second light emitting element, the second light emitting element emitting light of a complementary color of a second emission color when an initial emission color of the first light emitting element is referred to as a first emission color and an emission color of the first light emitting element after change over time is referred to as the second emission color; and a control means which controls light emission of the first light emitting element and that of the second light emitting element independently.

With the above structure, light emission of the first light emitting element and that of the second light emitting element can be controlled independently even in the case where the emission color of the first light emitting element changes from the first emission color to the second emission color as time passes. In addition, since the second emission color and an emission color of the second light emitting element are in a relation of complementary colors, a change in emission color of a light emitting region as a whole can be suppressed.

Another feature of the present invention is a lighting system including a light emitting region divided into a plurality of regions, each of the divided light emitting regions being provided with a plurality of light emitting elements, at least one of the plurality of light emitting elements being a first light emitting element including a plurality of light emitting units, at least of the plurality of light emitting elements being a second light emitting element, the second light emitting element including a light emitting unit formed of the same material as that of a light emitting unit having a short life among the plurality of light emitting units of the first light emitting element; and a control means which controls light emission of the first light emitting element and that of the second light emitting element independently.

With the above structure, light emission of the first light emitting element and that of the second light emitting element can be controlled independently even in the case where the emission color of the first light emitting element changes as time passes. Since the first light emitting element and the second light emitting element including a light emitting unit formed of the same material as that of a light emitting unit having a short life among the light emitting units included in the first light emitting element, are in the same divided light emitting region, a change in emission color of the light emitting region as a whole can be suppressed by controlling the light emission of the first light emitting element and that of the second light emitting element.

Another feature of the present invention is a lighting system including a light emitting region divided into a plurality of regions, each of the divided light emitting regions including a first light emitting element and a second light emitting element, the first light emitting element including a plurality of light emitting units, the second light emitting element including a light emitting unit formed of the same material as that of a light emitting unit having a short life among the plurality of light emitting units included in the first light emitting element; and a control means which controls light emission of the first light emitting element and that of the second light emitting element independently.

With the above structure, light emission of the first light emitting element and that of the second light emitting element can be controlled independently even in the case where the emission color of the first light emitting element changes as time passes. Since the first light emitting element and the second light emitting element including a light emitting unit formed of the same material as that of a light emitting unit having a short life among the light emitting units included in the first light emitting element, are in the same divided light emitting region, a change in emission color of the light emitting region as a whole can be suppressed by controlling the light emission of the first light emitting element and that of the second light emitting element.

Another feature of the present invention is a lighting system including a light emitting region divided into a plurality of regions, each of the divided light emitting regions including a first light emitting element provided with a plurality of light emitting units and a second light emitting element, an initial emission color of the first light emitting element being white, the second light emitting element emitting light of a complementary color of a second emission color when an emission color of the first light emitting element after change over time is referred to as the second emission color; and a control means which controls light emission of the second light emitting element with a change in emission color of the first light emitting element.

Another feature of the present invention is a lighting system including a light emitting region divided into a plurality of regions, each of the divided light emitting regions including a first light emitting element provided with a plurality of light emitting units and a second light emitting element, the first light emitting element emitting white light, the second light emitting element emitting light of the same color as that of a light emitting material having a short life among light emitting materials contained in the first light emitting element; and a control means which controls light emission of the second light emitting element with a change in emission color of the first light emitting element.

Another feature of the present invention is a lighting system including a light emitting region divided into a plurality of regions, each of the divided light emitting region including a first light emitting element provided with a plurality of light emitting units and a second light emitting element; and a control means which suppresses changes in luminance of the divided light emitting region as a whole by intensifying a luminance of the second light emitting element in accordance with a change in luminance of the first light emitting element from a first luminance to a second luminance when an initial luminance of the first light emitting element is referred to as the first luminance and a luminance of the first light emitting element after change over time is referred to as the second luminance.

Another feature of the present invention is a lighting system including a light emitting region and a monitor element, wherein the light emitting region is divided into a plurality of regions, each of the divided light emitting regions includes a first light emitting element provided with a plurality of light emitting units and a second light emitting element, and a control means which adjusts a luminance of the second light emitting element after t hours so as to satisfy Formula (1) when a luminance of the first light emitting element as a start of light emission is denoted by $L_{total}(0)$, a luminance of the first light emitting element after t hours by $L_{total}(t)$, an amount of change in luminance of the monitor element between at the start of light emission and after t hours by $\Delta L_{mon}$, and the luminance of the second light emitting element after t hours by $\Delta L_2$.

$$\Delta L_2 = L_{total}(0) - L_{total}(t) - \alpha \cdot \Delta L_{mon} \quad (1)$$

($\alpha$ is a factor with respect to luminance of the monitor element.)

In the above structure, the second light emitting element may be either a light emitting element including one light emitting unit or a light emitting element provided with a plurality of light emitting units.

Further, in the above structure, the plurality of light emitting regions may be formed in matrix or in stripes.

The lighting system of the present invention can emit light with high luminance because it has a stacked structure in which a plurality of light emitting units is stacked. In addition, the lighting system of the present invention causes little change in emission color even after being used for a long time and has a long life.

BRIEF DESCRIPTION OF THE DRAWINGS

FIGS. 13A and 13B are diagrams for explaining a lighting system of the present invention.

DETAILED DESCRIPTION OF THE INVENTION

Figure 1B:
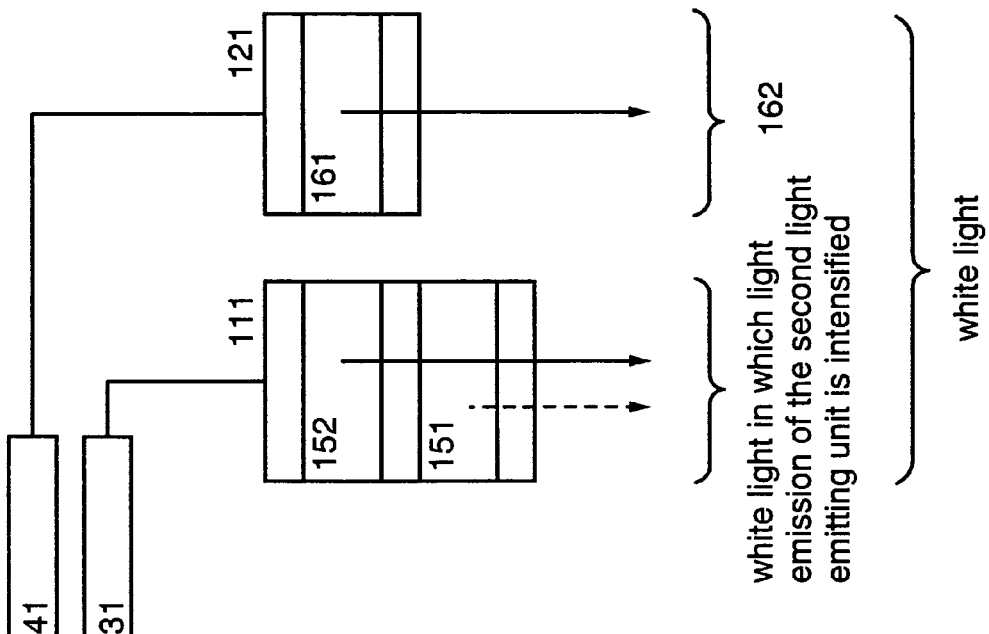
FIGS. 1A and 1B are diagrams for explaining a lighting system of the present invention.

Hereinafter, embodiment modes of the present invention are explained in detail with reference to the drawings. However, the present invention is not limited to the following explanation. As is easily known to a person skilled in the art, the mode and the detail of the present invention can be variously changed without departing from the spirit and the scope of the present invention. Therefore, the present invention is not interpreted as being limited to the following description of embodiment modes.

(Embodiment Mode 1)

This embodiment mode explains one mode of a lighting system of the present invention.

As for the lighting system of the present invention, a light emitting region is divided into a plurality of regions, and each of the divided light emitting regions includes a plurality of light emitting elements. One is a stacked light emitting element in which a plurality of light emitting units is stacked, and another is a correction light emitting element. The stacked light emitting element is referred to as a first light emitting element, and the correction light emitting element is referred to as a second light emitting element.

The first light emitting element is formed by stacking a plurality of light emitting units so as to provide a desired emission color as a whole. In other words, the first light emitting element is formed so that an initial emission color is a desired first emission color. For example, in the case of a light emitting element in which two light emitting units are stacked, a stacked light emitting element which emits white light can be obtained by stacking light emitting units which emit light of complementary colors.

The second light emitting element is a light emitting element which emits light of a complimentary color of an emission color (second emission color) after the first light emitting element is deteriorated. For example, in the case where the first light emitting element is formed by stacking two light emitting units so as to provide white light emission, a light emitting material used for a light emitting unit with a shorter life of the two light emitting units included in the first light emitting element can be used for the second light emitting element.

The lighting system of the present invention can provide light emission of the desired first emission color only by light emission of the first light emitting element. However, as for the first light emitting element that is the stacked light emitting element, deterioration occurs, an emission color changes, and luminance also changes as emission time passes. For example, the emission color of the first light emitting element changes from the first emission color to the second emission color. In addition, the luminance of the first light emitting element also changes from a first luminance to a second luminance. This is caused by a difference in deterioration with time of materials contained in the light emitting units.

Therefore, when the emission color of the first light emitting element is changed and luminance is decreased with time, light emission of the second light emitting element is intensified by a second control means to suppress changes in emission color and luminance of the divided light emitting region. In other words, light emission is controlled using a first control means which controls light emission of the first light emitting element and the second control means which controls light emission of the second light emitting element so that an emission color of one divided light emitting region does not change. Therefore, a change in emission color of the light emitting region as a whole can be suppressed. In addition, a change in luminance of the divided light emitting region as a whole can be suppressed. Note that the first light emitting element and the second light emitting element are preferably provided adjacent to each other. By providing the first light emitting element and the second light emitting element adjacent to each other, a difference between an emission color of the first light emitting element and that of the second light emitting element can be made unnoticeable.

As a result of suppressing changes in emission color and luminance of the divided light emitting region, changes in emission color and luminance of the light emitting region as a whole can be suppressed. In other words, the life of the lighting system can be extended. Accordingly, a long-life lighting system can be obtained by applying the present invention.

(Embodiment Mode 2)

Figure 5:
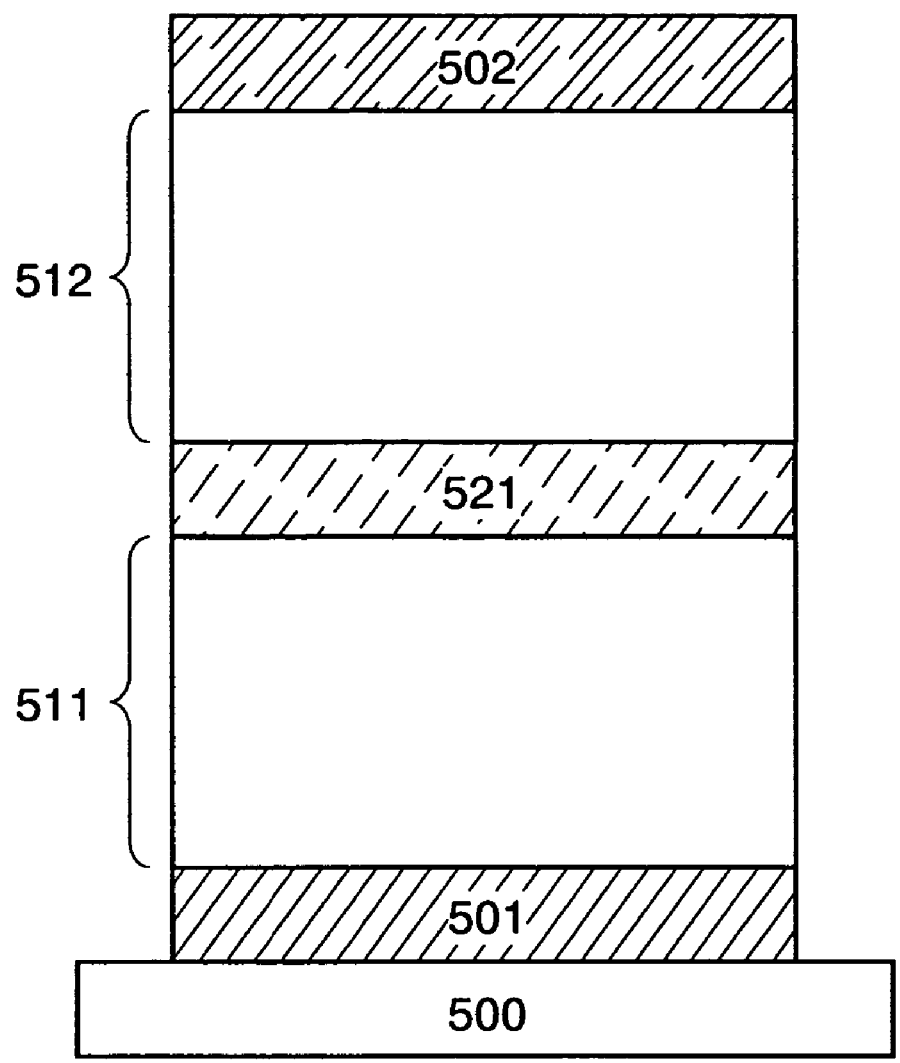
FIG. 5 is a diagram for explaining a light emitting element used for a lighting system of the present invention.

This embodiment mode explains a stacked light emitting element used for a lighting system of the present invention with reference to FIG. 5. The stacked light emitting element has a structure in which a plurality of light emitting units is stacked with a charge generation layer interposed therebetween. FIG. 5 shows a structure in which two light emitting units are stacked as one mode of the stacked light emitting element. In addition, this embodiment mode explains the case where a first electrode 501 functions as an anode and a second electrode 502 functions as a cathode.

A substrate 500 is used as a support for the light emitting element. For the substrate 500, for example, glass, plastic, or the like can be used. Note that another material may alternatively be used as long as it functions as a support in a manufacturing process.

For the anode, various materials can be used, and metal, an alloy, a conductive compound, a mixture thereof, or the like having a high work function (specifically, 4.0 eV or higher) is preferably used. Specifically, indium tin oxide (hereinafter referred to as ITO), indium tin oxide containing silicon, indium oxide containing zinc oxide (ZnO) of 2 wt % to 20 wt %, or the like can be used. Alternatively, gold (Au), platinum (Pt), nickel (Ni), tungsten (W), chromium (Cr), molybdenum (Mo), iron (Fe), cobalt (Co), copper (Cu), palladium (Pd), nitride of a metal material (for example, titanium nitride (TiN)), or the like can be used.

On the other hand, for the cathode, various materials can be used, and metal, an alloy, a conductive compound, a mixture thereof, or the like having a low work function (specifically, 3.8 eV or lower) is preferably used. Specifically, metal belonging to Group 1 or 2 of the periodic table, that is, alkali metal such as lithium (Li) or cesium (Cs); alkaline earth metal such as magnesium (Mg), calcium (Ca), or strontium (Sr); an alloy containing these (MgAg, AlLi, or the like); rare-earth metal such as europium (Eu) or ytterbium (Yb); an alloy containing these; or the like can be used. Note that the cathode can also be formed using a material having a high work function, that is, a material generally used for the anode when using an electron injection layer having a high electron injecting property. For example, the cathode can be formed of metal such as Al or Ag, or a conductive inorganic compound such as ITO.

A charge generation layer 521 is a layer serving to inject carriers into a first light emitting unit 511 and a second light emitting unit 512. The charge generation layer 521 is preferably formed of a material having a high visible light transmittance, and a transparent conductive film, for example, a film of indium tin oxide (ITO), indium tin oxide containing silicon, indium oxide containing zinc oxide (ZnO) of 2 wt % to 20 wt %, or the like can be used. In addition, it can be formed to contain not only an inorganic compound but also an organic compound.

Various materials can be used for the first light emitting unit 511 and the second light emitting unit 512, and either a low molecular material or a high molecular material can be used. Note that the first light emitting unit 511 and the second light emitting unit 512 may be formed to contain not only an organic compound material but also an inorganic compound in part. The light emitting unit is formed by appropriately combining a hole injection layer, a hole transport layer, a hole blocking layer, a light emitting layer, an electron transport layer, an electron injection layer, and the like. It may have a single-layer structure or a stacked structure of a plurality of layers.

In addition, the light emitting unit can be formed by various methods such as an evaporation method, an ink-jet method, a spin coating method, or a dip coating method regardless of whether a wet method or a dry method.

Hereinafter, specific materials used for the hole injection layer, the hole transport layer, the light emitting layer, the electron transport layer, and the electron injection layer are described.

As a hole injecting material for forming the hole injection layer, various materials can be used. Specifically, metal oxide such as vanadium oxide, molybdenum oxide, ruthenium oxide, or aluminum oxide is preferable. The above oxide may be mixed with an appropriate organic compound. Alternatively, a porphyrin-based compound is effective among organic compounds, and phthalocyanine (abbr.: $H_2Pc$), copper phthalocyanine (abbr.: CuPc), or the like can be used. Further, a chemically-doped conductive high molecular compound can be used, such as polyethylene dioxythiophene (abbr.: PEDOT) doped with polystyrene sulfonate (abbr.: PSS), or polyaniline (abbr.: PAni).

As a hole transporting material for forming the hole transport layer, an aromatic amine-based compound (that is, a compound having a benzene ring-nitrogen bond) is preferable. A widely-used material is a star-burst aromatic amine compound like N,N'-bis(3-methylphenyl)-N,N'-diphenyl-[1,1'-biphenyl]-4,4'-diamine (hereinafter referred to as TPD), a derivative thereof such as 4,4'-bis[N-(1-naphthyl)-N-phenyl-amino]-biphenyl (hereinafter referred to as α-NPD), 4,4',4''-tris(N-carbazolyl)-triphenylamine (hereinafter referred to as TCTA), 4,4',4''-tris(N,N-diphenyl-amino)-triphenylamine (hereinafter referred to as TDATA), or 4,4',4''-tris[N-(3-methylphenyl)-N-phenyl-amino]-triphenylamine (hereinafter referred to as MTDATA).

In addition, as a light emitting material for forming the light emitting layer, an effective material is specifically various fluorescent materials as well as a metal complex such as tris(8-quinolinolato)aluminum (hereinafter referred to as $Alq_3$), tris(4-methyl-8-quinolinolato)aluminum (hereinafter referred to as $Almq_3$), bis(10-hydroxybenzo[h]-quinolinato)beryllium (hereinafter referred to as $BeBq_2$), bis(2-methyl-8-quinolinolato)-(4-hydroxy-biphenylyl)-aluminum (hereinafter referred to as BAlq), bis[2-(2-hydroxyphenyl)-benzoxazolato]zinc (hereinafter referred to as $Zn(BOX)_2$), or bis[2-(2-hydroxyphenyl)-benzothiazolato]zinc (hereinafter referred to as $Zn(BTZ)_2$).

Note that in the case of forming the light emitting layer in combination with a guest material, a triplet light emitting material (phosphorescent material) such as bis(2-(2'-benzothienyl)pyridinato-N,$C^{3'}$)(acetylacetonato)iridium (abbr.: $Ir(btp)_2(acac)$) as well as a singlet light emitting material (fluorescent material) such as 4-(dicyanomethylene)-2-methyl-6-(p-dimethylaminostyryl)-4H-pyran (abbr.: DCM1), 4-(dicyanomethylene)-2-methyl-6-(joulolidine-4-yl-vinyl)-4H-pyran (abbr.: DCM2), N,N'-dimethylquinacridon (abbr.: DMQd), 9,10-diphenylanthracene, 5,12-diphenyltetracene (abbr.: DPT), coumarin 6, perylene, or rubrene, can be used as the guest material.

As an electron transporting material for forming the electron transport layer, a metal complex such as above-mentioned $Alq_3$, tris(4-methyl-8-quinolinolato)aluminum (abbr.: $Almq_3$), bis(2-methyl-8-quinolinolato)-4-phenylphenolato-aluminum (abbr.: BAlq), tris(8-quinolinolato)gallium (abbr.: $Gaq_3$), bis(2-methyl-8-quinolinolato)-4-phenylphenolato-gallium (abbr.: BGaq), bis(10-hydroxybenzo[h]-quinolinato)beryllium (abbr.: $BeBq_2$), bis[2-(2-hydroxyphenyl)benzoxazolato]zinc (abbr.: $Zn(BOX)_2$), or bis[2-(2-hydroxyphenyl)benzothiazolato]zinc (abbr.: $Zn(BTZ)_2$) can be used. As well as the metal complex, 2-(4-biphenylyl)-5-(4-tert-butylphenyl)-1,3,4-oxadiazole (abbr.: PBD), 1,3-bis[5-(p-tert-butylphenyl)-1,3,4-oxadiazole-2-yl]benzene (abbr.: OXD-7), 3-(4-tert-butylphenyl)-4-phenyl-5-(4-biphenylyl)-1,2,4-triazole (abbr.: TAZ), 3-(4-tert-butylphenyl)-4-(4-ethylphenyl)-5-(4-biphenylyl)-1,2,4-triazole (abbr.: p-EtTAZ), bathophenanthroline (abbr.: BPhen), bathocuproin (abbr.: BCP), or the like can be used.

As an electron injecting material which can be used for the electron injection layer, the above-described electron transporting material can be used. Alternatively, an ultrathin film of an insulator, for example, alkali metal halide such as LiF or CsF, alkaline earth halide such as $CsF_2$, or alkali metal oxide such as $Li_2O$ is commonly used. In addition, an alkali metal complex such as lithium acetylacetonate (abbr.: Li(acac)) or 8-quinolinolato-lithium (abbr.: Liq) is also effective. Furthermore, a layer in which the above-described electron transporting material and metal having a low work function such as Mg, Li, or Cs are combined with each other can be used as the electron injection layer. In addition, metal oxide such as molybdenum oxide ($MoO_x$), vanadium oxide ($VO_x$), ruthenium oxide ($RuO_x$), or tungsten oxide ($WO_x$) or a benzoxazole derivative, and one or more of alkali metal, alkaline earth metal, or transition metal may be contained. Moreover, titanium oxide may be used.

Note that FIG. 5 shows the structure in which two light emitting units are provided, but the present invention is not limited thereto. Three or more light emitting units may be provided. In addition, light emitting units to be stacked do not need to have the same structure, and light emitting units formed of different materials may be stacked.

In addition, a light emitting unit including a single light emitting unit can also be formed using the above-described materials appropriately.

(Embodiment Mode 3)

Figure 1A:
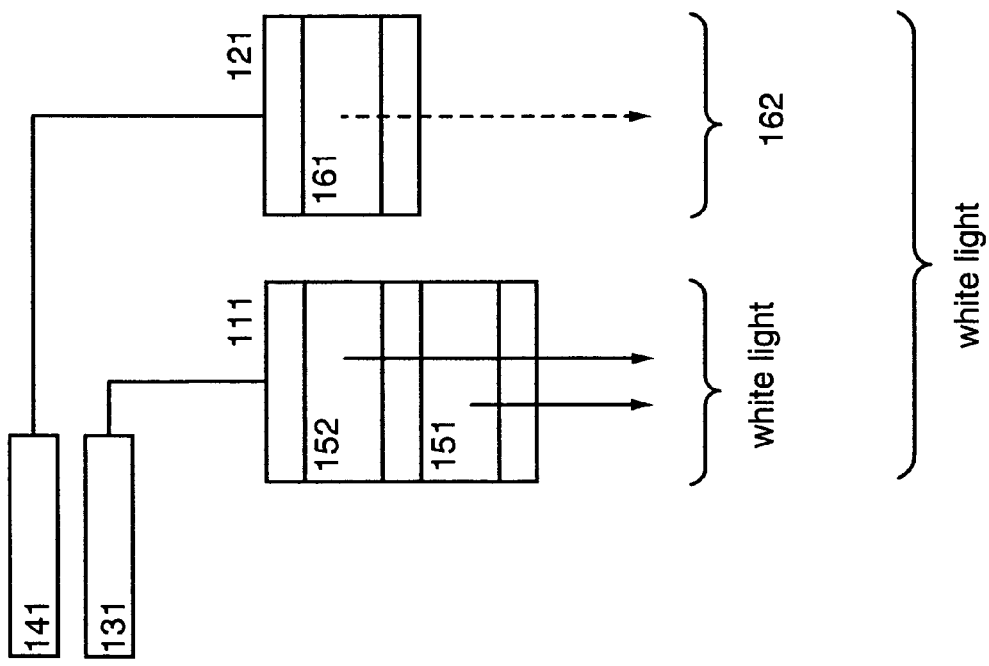

This embodiment mode explains a lighting system which uses a stacked light emitting element including two light emitting units as a first light emitting element and a light emitting element including one light emitting unit as a second light emitting element, with reference to FIGS. 1A and 1B. Although this embodiment mode explains the case where a divided light emitting region emits white light, the present invention can be applied to a case other than the case of white light emission.

In this embodiment mode, a first light emitting element 111 is a stacked light emitting element including two light emitting units. A first light emitting unit 151 and a second light emitting unit 152 contain different light emitting materials and emit light of different colors. For example, white light emission can be achieved by forming the first light emitting unit 151 to emit blue light and the second light emitting unit 152 to emit orange light and optimizing thickness by optical design.

A second light emitting element 121 includes one light emitting unit 161 and contains a light emitting material which is contained in the first light emitting element and contained in the first light emitting unit 151 having a shorter life than that of the second light emitting unit 152.

In other words, the first light emitting element 111 is formed to emit white light at the start of light emission, and the second light emitting element 121 is formed to emit light of the same color 162 as that of the first light emitting unit.

The lighting system described in this embodiment mode realizes aimed white light emission only by light emission of the first light emitting element 111 at the start of light emission (FIG. 1A). However, an emission color and luminance of the first light emitting element are changed as time passes. When the length of life of the light emitting material contained in the first light emitting unit included in the first light emitting element is short, the emission color of the first light emitting element 111 becomes close to an emission color of the light emitting material contained in the second light emitting unit. In other words, the emission color of the first light emitting element changes from a first emission color at the start of light emission to a second emission color. In addition, the luminance of the first light emitting element also changes from a first luminance at the start of light emission to a second luminance.

Therefore, light emission of the second light emitting element 121 is intensified in accordance with changes in emission color and luminance of the first light emitting element 111. The light emission of the second light emitting element 121 which provides a complementary color of the second emission color, that is, the same emission color as that of the first light emitting unit is intensified, and the intensity of light emission is adjusted so as to maintain the emission color of one divided light emitting region to white (FIG. 1B).

Luminances of the first light emitting element 111 and the second light emitting element 121 are controlled using a first control means 131 and a second control means 141, respectively. The first control means 131 and the second control means 141 control the intensity of light emission, that is, luminance of the light emitting element based on pre-measured deterioration characteristics over time of the light emitting element or deterioration characteristics of a monitor element.

The monitor element used for the lighting system of the present invention contains the same light emitting material as that contained in a light emitting unit having a longer life of the light emitting units included in the first light emitting element 111. In other words, it contains the same light emitting material as that of the second light emitting unit 152 in this embodiment mode.

When the luminance of the first light emitting element at the start of light emission is denoted by $L_{total}(0)$, the luminance of the first light emitting element after t hours by $L_{total}(t)$, the amount of change in luminance of the monitor element between at the start of light emission and after t hours by $\Delta L_{mon}$, and the luminance of the second light emitting element after t hours by $\Delta L_2$, the luminance of the second light emitting element after t hours is adjusted so as to satisfy Formula (1).

$$\Delta L_2 = L_{total}(0) - L_{total}(t) - \alpha \cdot L_{mon} \quad (1)$$

($\alpha$ is a factor with respect to luminance of the monitor element.)

By adjusting the luminance of the second light emitting element after t hours to satisfy Formula (1), changes in emission color and luminance of a divided light emitting region can be suppressed. Therefore, a duration of time for which an aimed emission color is obtained becomes long; accordingly, changes in emission color and luminance of the light emitting region as a whole can be suppressed, and a long-life lighting system can be obtained.

Note that when the second light emitting element 121 is formed using all the same materials as those of the first light emitting unit included in the first light emitting element 111, the lighting system of the present invention can be manufactured without increasing the number of steps.

In addition, when the monitor element is formed using all the same materials as those of the second light emitting unit 152 included in the first light emitting element 111, the lighting system of the present invention can be manufactured without increasing the number of steps.

Accordingly, a long-life lighting system can be obtained without increasing the number of steps.

In addition, an error in luminance control can be reduced by using a long-life light emitting material for the monitor element. When a short-life light emitting material is used, a change in luminance over time is significant, which leads to a significant error.

In addition, the monitor element is provided at the periphery of a panel, which is susceptible to external influence. Specifically, the monitor element is in an environment where it is easily exposed to moisture and the like which penetrate a sealant; therefore, the monitor element is desired to be an element which is hardly deteriorated. Since the monitor element used in the present invention is formed using a long-life light emitting material, it is hardly deteriorated. Thus, the monitor element used in the present invention has excellent characteristics.

(Embodiment Mode 4)

Figure 2B:
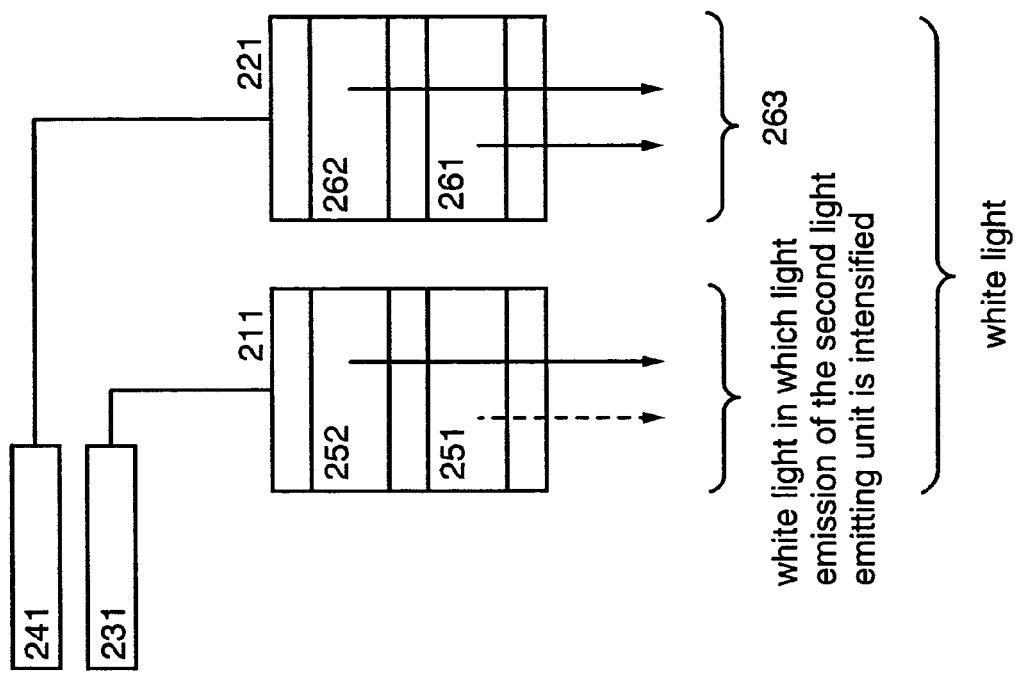
FIGS. 2A and 2B are diagrams for explaining a lighting system of the present invention.
Figure 2A:
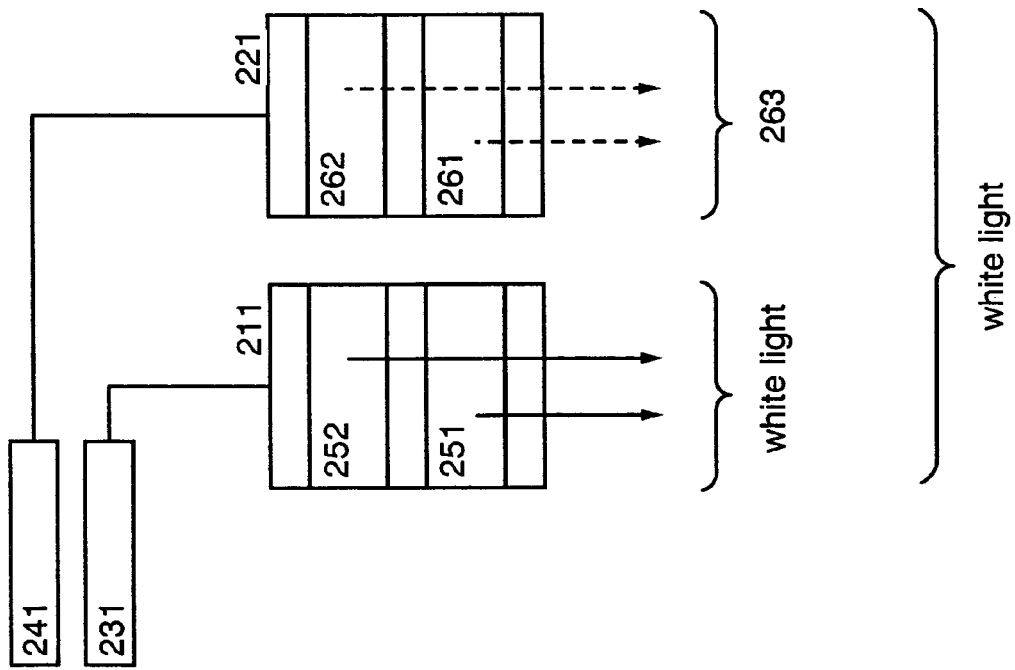

This embodiment mode explains a lighting system which uses a stacked light emitting element including two light emitting units as a first light emitting element and a stacked light emitting element including two light emitting units as a second light emitting element, with reference to FIGS. 2A and 2B. Although this embodiment mode explains the case where a divided light emitting region emits white light, the present invention can be applied to a case other than the case of white light emission.

In this embodiment mode, each of a first light emitting element 211 and a second light emitting element 221 is a stacked light emitting element including two light emitting units. A first light emitting unit and a second light emitting unit contain different light emitting materials and emit light of different colors. For example, white light emission can be achieved by forming a first light emitting unit 251 of the first light emitting element 211 to emit blue light and a second light emitting unit 252 thereof to emit orange light that is a complementary color of the emission color of the first light emitting unit, and optimizing thickness by optical design. Note that an element, in which a first light emitting unit and a second light emitting unit have the same thickness and the stacking order thereof is interchanged, has a different optical design, so that white light emission cannot be achieved. In other words, white light emission cannot be achieved when forming a first light emitting unit 261 of the second light emitting element 221 to emit orange light and a second light emitting unit 262 thereof to emit blue light. In this embodiment mode, the first light emitting element 211 is formed to emit white light and the second light emitting element 221 is formed to emit white light 263 in which the intensity of blue light that is an emission color of the first light emitting unit is high (bluish white light) at the start of light emission.

The lighting system described in this embodiment mode can achieve aimed white light emission only by light emission of the first light emitting element at the start of light emission (FIG. 2A). However, the emission color and luminance of the first light emitting element are changed as time passes. When the length of life of a light emitting material contained in the first light emitting unit 251 included in the first light emitting element 211 is short, the emission color of the first light emitting element becomes close to an emission color of a light emitting material contained in the second light emitting unit 252. In other words, the emission color of the first light emitting element changes from a first emission color at the start of light emission to a second emission color. In addition, the luminance of the first light emitting element also changes from a first luminance at the start of light emission to a second luminance.

Therefore, light emission of the second light emitting element 221 is intensified in accordance with a change in emission color of the first light emitting element 211. Light emission of a complementary color of the second emission color, that is, the light emission of the second light emitting element in which the intensity of light emission of the first light emitting unit is higher is intensified, thereby adjusting so as to maintain an emission color of one divided light emitting region to white (FIG. 2B).

Luminances of the first light emitting element 211 and the second light emitting element 221 are controlled using a first control means 231 and a second control means 241, respectively. The first control means 231 and the second control means 241 control the intensity of light emission, that is, luminance of the light emitting element based on pre-measured deterioration characteristics over time of the light emitting element or deterioration characteristics of a monitor element as described in Embodiment Mode 3.

The monitor element used in this embodiment mode contains the same light emitting material as that contained in a light emitting unit having a longer life of the light emitting units included in the first light emitting element. In other words, the monitor element contains the same light emitting material as that of the second light emitting unit 252.

When the luminance of the first light emitting element at the start of light emission is denoted by $L_{total}(0)$, the luminance of the first light emitting element after t hours by $L_{total}(t)$, the amount of change in luminance of the monitor element between at the start of light emission and after t hours by $\Delta L_{mon}$, and the luminance of the second light emitting element after t hours by $\Delta L_2$, the luminance of the second light emitting element after t hours is adjusted so as to satisfy Formula (1).

$$\Delta L_2 = L_{total}(0) - L_{total}(t) - \alpha \cdot \Delta L_{mon} \quad (1)$$

($\alpha$ is a factor with respect to luminance of the monitor element.)

By adjusting the luminance of the second light emitting element after t hours to satisfy Formula (1), changes in emission color and luminance of a divided light emitting region can be suppressed. Therefore, a duration of time for which an aimed emission color is obtained becomes long; accordingly, changes in emission color and luminance of the light emitting region as a whole can be suppressed, and a long-life lighting system can be obtained.

Note that thicknesses of the first light emitting unit and the second light emitting unit may be changed. For example, a thickness of the first light emitting unit included in the first light emitting element and that of the first light emitting unit included in the second light emitting element may be different from each other.

(Embodiment Mode 5)

Figure 3A:
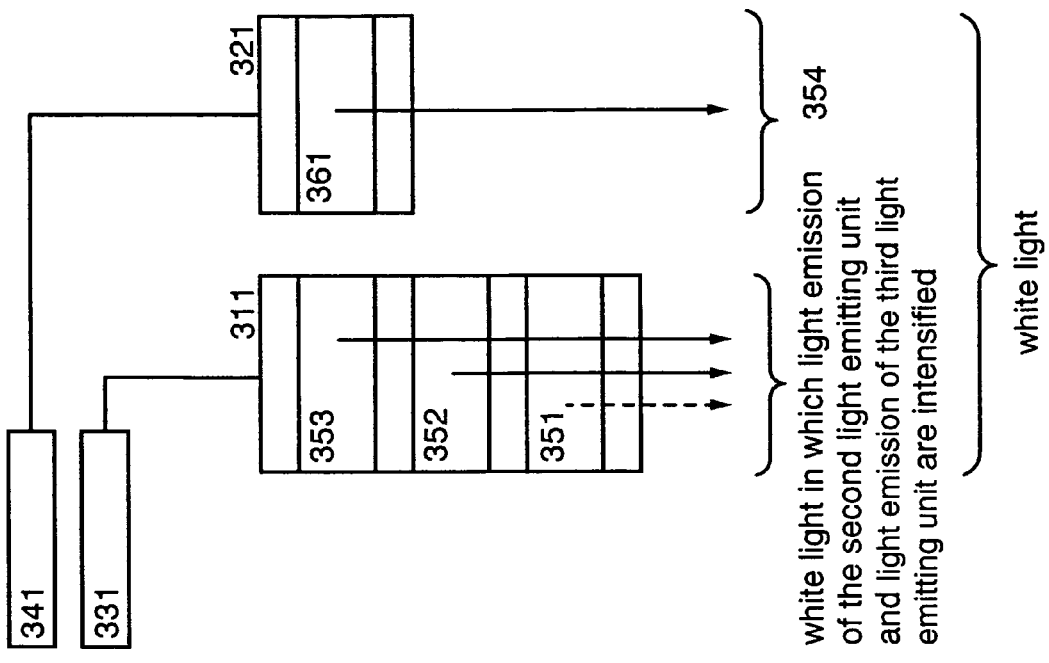
FIGS. 3A and 3B are diagrams for explaining a lighting system of the present invention.
Figure 3B:
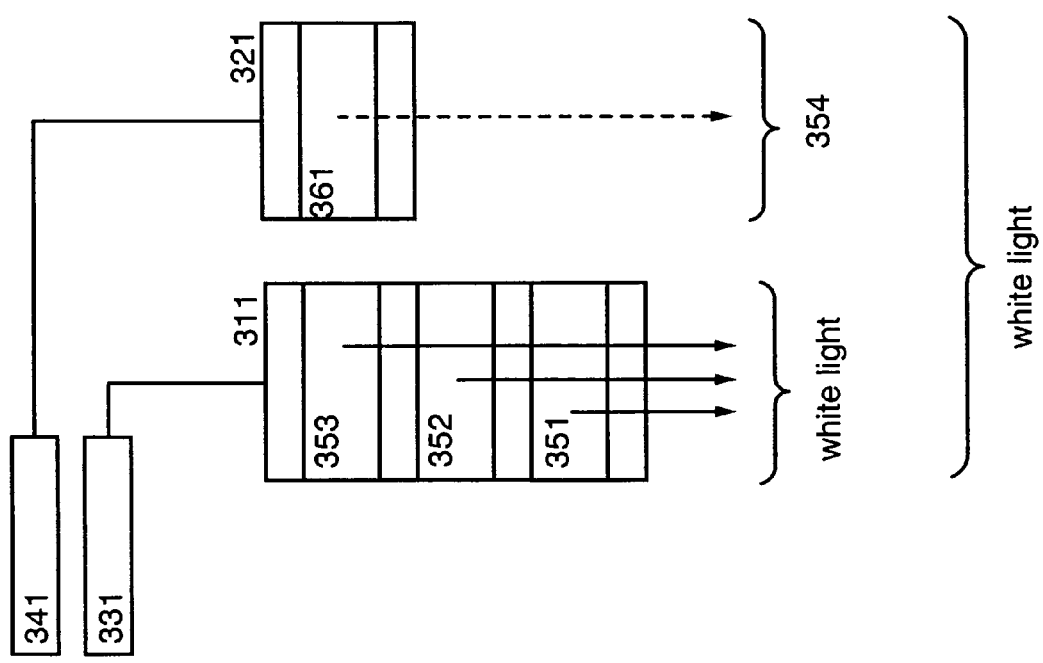

This embodiment mode explains a lighting system which uses a stacked light emitting element including three light emitting units with reference to FIGS. 3A and 3B. As for the stacked light emitting element including three light emitting units, a change in emission color caused with time can be suppressed by controlling light emission of each light emitting unit, similarly to the case of the stacked light emitting element including two light emitting units. Although this embodiment mode explains the case of emitting white light, the present invention can be applied to a case other than the case of white light emission.

A first light emitting element 311 includes a first light emitting unit 351, a second light emitting unit 352, and a third light emitting unit 353, and each light emitting unit contains a different light emitting material. For example, white light emission can be achieved by forming the first light emitting unit 351 to emit blue light, the second light emitting unit 352 to emit green light, and the third light emitting unit 353 to emit red light, and optimizing thicknesses by optical design.

A second light emitting element 321 includes one light emitting unit 361 and contains a light emitting material which is contained in a light emitting unit having a shorter life of the light emitting units included in the first light emitting element 311. This embodiment mode explains the case where the length of life of a light emitting material contained in the first light emitting unit is shorter than those of the second light emitting unit and the third light emitting unit.

In other words, the first light emitting element 311 is formed to emit white light at the start of light emission, and the second light emitting element 321 is formed to emit light 354 of the same emission color as that of the first light emitting unit.

The lighting system described in this embodiment mode can achieve aimed white light emission only by light emission of the first light emitting element 311 at the start of light emission (FIG. 3A). However, the emission color and luminance of the first light emitting element 311 are changed as time passes. When the length of life of the light emitting material contained in the first light emitting unit included in the first light emitting element is short, the emission color of the first light emitting element becomes close to a mixed color of emission colors of the light emitting materials contained in the second light emitting unit and the third light emitting unit. In other words, the emission color of the first light emitting element changes from a first emission color at the start of light emission to a second emission color. In addition, the luminance of the first light emitting element also changes from a first luminance at the start of light emission to a second luminance.

Therefore, light emission of the second light emitting element 321 is intensified in accordance with changes in emission color and luminance of the first light emitting element 311. The light emission of the second light emitting element which emits light of a complementary color of the second emission color, that is, the same emission color 354 as that of the first light emitting unit is intensified, and the intensity of light emission is adjusted so as to maintain an emission color of one divided light emitting region to white (FIG. 3B).

Luminances of the first light emitting element 311 and the second light emitting element 321 are controlled using a first control means 331 and a second control means 341, respectively. The first control means 331 and the second control means 341 control the intensity of light emission, that is, luminance of the light emitting element based on pre-measured deterioration characteristics over time of the light emitting element or deterioration characteristics of a monitor element.

The monitor element used for the lighting system of the present invention contains the same light emitting material as that contained in a light emitting unit having a longer life of the light emitting units included in the first light emitting element 311. In other words, the monitor element in this embodiment mode contains the same light emitting material as those of the second light emitting unit and the third light emitting unit.

When the luminance of the first light emitting element at the start of light emission is denoted by $L_{total}(0)$, the luminance of the first light emitting element after t hours by $L_{total}(t)$, the amount of change in luminance of the monitor element between at the start of light emission and after t hours by $\Delta L_{mon}$, and the luminance of the second light emitting element after t hours by $\Delta L_2$, the luminance of the second light emitting element after t hours is adjusted so as to satisfy Formula (1).

$$\Delta L_2 = L_{total}(0) - L_{total}(t) - \alpha \cdot \Delta L_{mon} \quad (1)$$

($\alpha$ is a factor with respect to luminance of the monitor element.)

By adjusting the luminance of the second light emitting element after t hours to satisfy Formula (1), changes in emission color and luminance of a divided light emitting region can be suppressed. Therefore, a duration of time for which an aimed emission color is obtained becomes long; accordingly, a long-life lighting system can be obtained.

Note that when the second light emitting element is formed using all the same materials as those of the first light emitting unit included in the first light emitting element, the lighting system of the present invention can be formed without increasing the number of steps.

In addition, when the monitor element is formed using all the same materials as those of the second light emitting unit and the third light emitting unit included in the first light emitting element, the lighting system of the present invention can be formed without increasing the number of steps.

Accordingly, a long-life lighting system can be obtained without increasing the number of steps.

In addition, an error in luminance control can be reduced by using a long-life light emitting material for the monitor element. When a short-life light emitting material is used, a change in luminance over time is significant, which leads to a significant error.

The monitor element is provided at the periphery of a panel, which is susceptible to external influence. Specifically, the monitor element is in an environment where it is easily exposed to moisture and the like which penetrate a sealant; therefore, the monitor element is desired to be an element which is hardly deteriorated. Since the monitor element used in the present invention is formed using a long-life light emitting material, it is hardly deteriorated. Thus, the monitor element used in the present invention has excellent characteristics.

Note that thicknesses of the light emitting units may be either the same or different.

(Embodiment Mode 6)

Figure 4B:
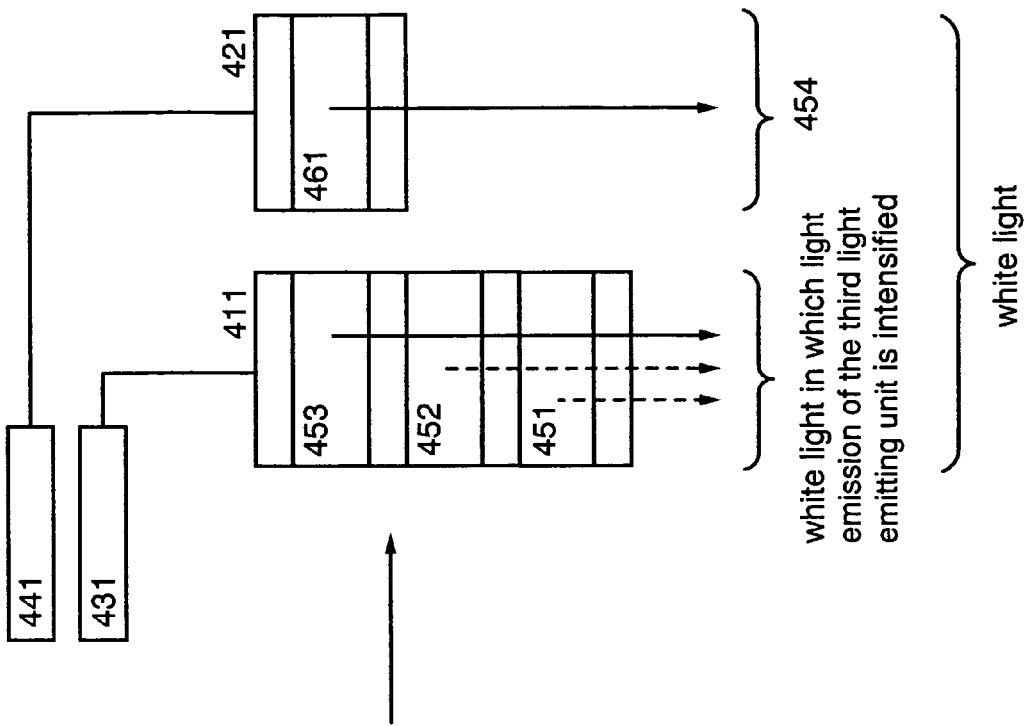
FIGS. 4A and 4B are diagrams for explaining a lighting system of the present invention.
Figure 4A:
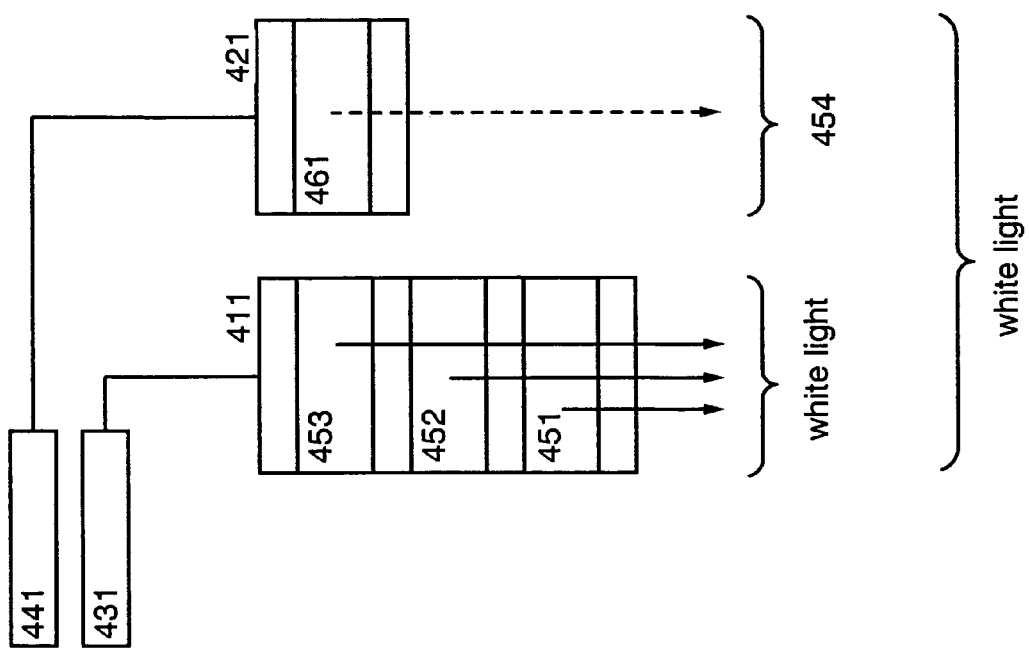

This embodiment mode explains a lighting system which uses a stacked light emitting element including three light emitting units with reference to FIGS. 4A and 4B. As for the stacked light emitting element including three light emitting units, a change in emission color caused with time can be suppressed by controlling light emission of each light emitting unit, similarly to the case of the stacked light emitting element including two light emitting units. Although this embodiment mode explains the case of emitting white light, the present invention can be applied to a case other than the case of white light emission.

A first light emitting element 411 includes a first light emitting unit 451, a second light emitting unit 452, and a third light emitting unit 453, and the light emitting units contain different light emitting materials. For example, white light emission can be achieved by forming the first light emitting unit 451 to emit blue light, the second light emitting unit 452 to emit green light, and the third light emitting unit 453 to emit red light, and optimizing thicknesses by optical design.

This embodiment mode explains the case where light emitting materials contained in the first light emitting unit and the second light emitting unit included in the first light emitting element are deteriorated more easily than a light emitting element contained in the third light emitting unit.

A second light emitting element 421 is a light emitting element which emits light of a complementary color after the first light emitting element is deteriorated over time. The second light emitting element may be a light emitting element including one light emitting unit, or a stacked light emitting element including two light emitting units. This embodiment mode explains the case where the second light emitting element includes one light emitting unit 461.

In other words, the first light emitting element 411 is formed to emit white light at the start of light emission, and the second light emitting element 421 is formed to emit light 454 of a complementary color of an emission color of the deteriorated first light emitting element. For example, when the life of the light emitting material which emits blue light and that of the light emitting material which emits green light are short in the first light emitting element, the second light emitting element is formed to contain a light emitting material which emits light-blue light.

The lighting system described in this embodiment mode can achieve aimed white light emission only by light emission of the first light emitting element 411 at the start of light emission (FIG. 4A). However, the emission color and luminance of the first light emitting element 411 are changed as time passes. Since the lengths of lives of the light emitting materials contained in the first light emitting unit and the second light emitting unit are shorter than that of the light emitting material contained in the third light emitting unit in the first light emitting element, the emission color of the first light emitting element becomes close to the emission color of the third light emitting unit. In other words, the emission color of the first light emitting element changes from a first emission color at the start of light emission to a second emission color. In addition, the luminance of the first light emitting element also changes from a first luminance at the start of light emission to a second luminance.

Therefore, light emission of the second light emitting element 421 is intensified in accordance with changes in emission color and luminance of the first light emitting element 411. In other words, the light emission of the second light emitting element which emits light 454 of a complementary color of an emission color (second emission color) of the first light emitting element after change over time is intensified, and the intensity of light emission is adjusted so as to maintain an emission color of a divided light emitting region to white (FIG. 4B).

The intensity of light emission of the first light emitting element and that of the second light emitting element are controlled using a first control means and a second control means, respectively. The first control means and the second control means control the intensity of light emission, that is, luminance of the light emitting element based on pre-measured deterioration characteristics over time of the light emitting element or deterioration characteristics of a monitor element.

The monitor element used for the lighting system of the present invention contains the same light emitting material as that contained in a light emitting unit having a longer life of the light emitting units included in the first light emitting element. In other words, the monitor element in this embodiment mode contains the same light emitting material as that of the third light emitting unit.

When the luminance of the first light emitting element at the start of light emission is denoted by $L_{total}(0)$, the luminance of the first light emitting element after t hours by $L_{total}(t)$, the amount of change in luminance of the monitor element between at the start of light emission and after t hours by $\Delta L_{mon}$, and the luminance of the second light emitting element after t hours by $\Delta L_2$, the luminance of the second light emitting element after t hours is adjusted so as to satisfy Formula (1).

$$\Delta L_2 = L_{total}(0) - L_{total}(t) - \alpha \cdot \Delta L_{mon} \quad (1)$$

(a is a factor with respect to luminance of the monitor element.)

Changes in emission color and luminance of the divided light emitting region can be suppressed by adjusting the luminance of the second light emitting element after t hours so as to satisfy Formula (1). Therefore, a duration of time for which an aimed emission color is obtained becomes long; accordingly, a long-life lighting system can be obtained.

In addition, an error in luminance control can be reduced by using a long-life light emitting material for the monitor element. When a short-life light emitting material is used, a change in luminance over time is significant, which leads to a significant error.

The monitor element is provided at the periphery of a panel, which is susceptible to external influence. Specifically, the monitor element is in an environment where it is easily exposed to moisture and the like which penetrate a sealant; therefore, the monitor element is desired to be an element which is hardly deteriorated. Since the monitor element used in the present invention is formed using a long-life light emitting material, it is hardly deteriorated. Thus, the monitor element used in the present invention has excellent characteristics.

(Embodiment Mode 7)

Figure 12:
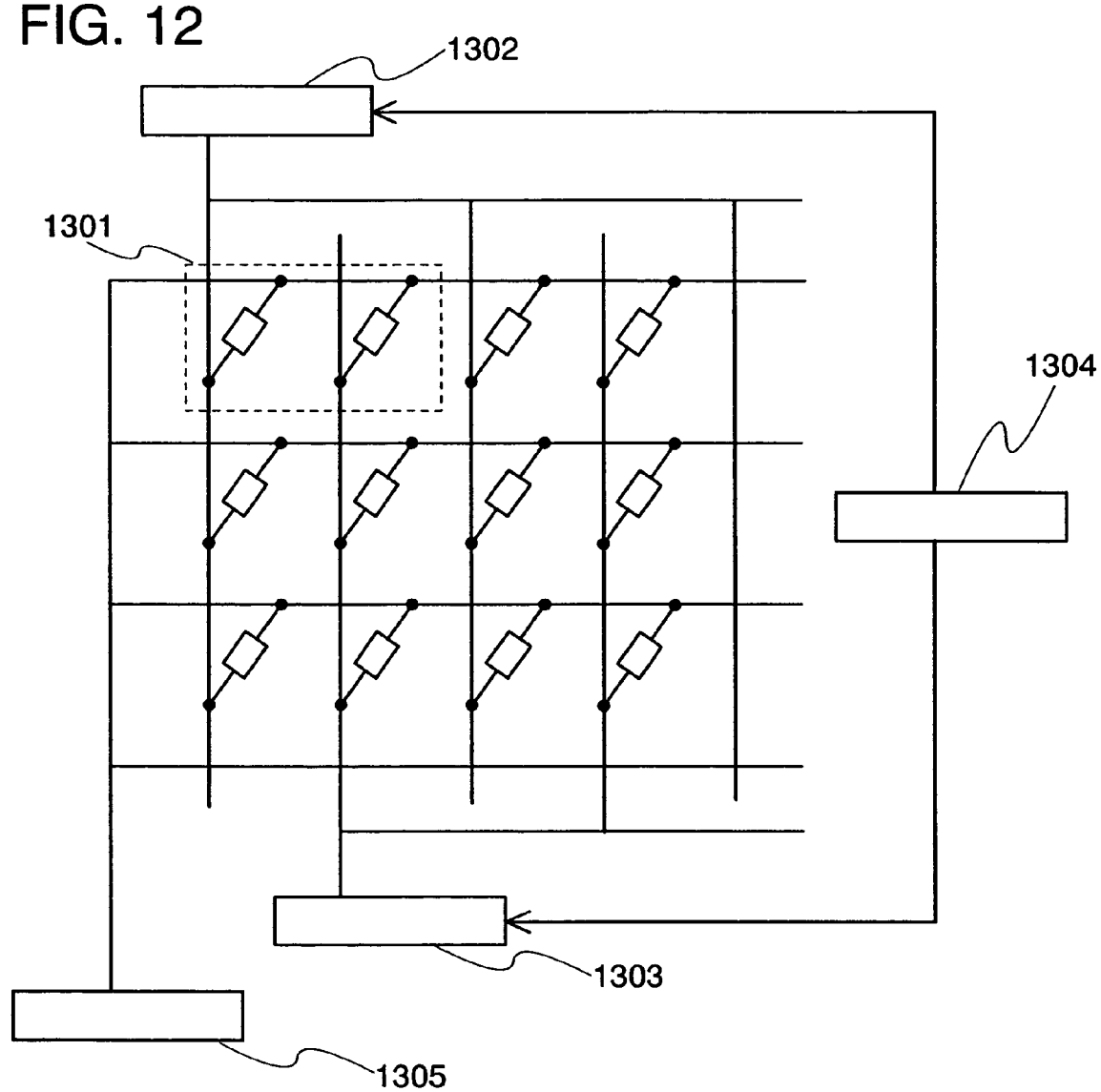
FIG. 12 is a diagram for explaining a lighting system of the present invention.

This embodiment mode explains a method for changing the amount of a current applied to each light emitting element in a divided light emitting region with reference to FIG. 12.

In FIG. 12, a divided light emitting region 1301 includes two light emitting elements. Each light emitting element is controlled based on signals inputted from a first control circuit 1302 and a second control circuit 1303. In addition, the luminance of each light emitting element is determined depending on the values of currents supplied from the first control circuit 1302 and the second control circuit 1303. The values of currents supplied from the first control circuit 1302 and the second control circuit 1303 determine the amount of a current to be applied to the light emitting element depending on the degree of change over time of the light emitting element, which is calculated by a monitor circuit 1304.

A change in emission color of each light emitting element over time is calculated using a monitoring light emitting element or using a result of lighting time of the light emitting element and pre-measured deterioration characteristics of the light emitting element. The degree of change over time which is calculated by the monitor circuit 1304 is inputted to the first control circuit 1302 and the second control circuit 1303 to determine the amount of a current to be supplied to each light emitting element.

In the case of a structure without using the monitor element, signals from a memory in which pre-measured deterioration characteristics over time of the light emitting element are recorded and a timer which measures light emitting time are inputted into the monitor circuit 1304, and the degree of change over time which is calculated by the monitor circuit 1304 is inputted into the first control circuit 1302 and the second control circuit 1303 to determine the amount of a current to be supplied to each light emitting element.

This enables luminances of two light emitting elements in the divided light emitting region to be controlled independently.

Note that in the lighting system of the present invention, luminances of a plurality of light emitting elements in a divided light emitting region can be controlled independently, so that an emission color can be controlled so as to maintain an emission color of the divided light emitting region. Thus, the emission color and luminance of the light emitting region as a whole can be maintained. Although the method for preventing an emission color from changing is described above, a tone of the emission color can be changed by using a control means (such as a control circuit, a power supply circuit, or a monitor circuit).

In addition, FIG. 12 shows only light emitting elements in the divided light emitting region 1301, but a thin film transistor (TFT) may be formed as a control means which controls light emission of the light emitting element.

(Embodiment Mode 8)

This embodiment mode explains a structure of a light emitting region of the lighting system of the present invention. Explanation is made with reference to FIG. 6. In the lighting system of the present invention, a light emitting region is divided into a plurality of regions and each of the divided light emitting regions includes a plurality of light emitting elements.

Figure 6:
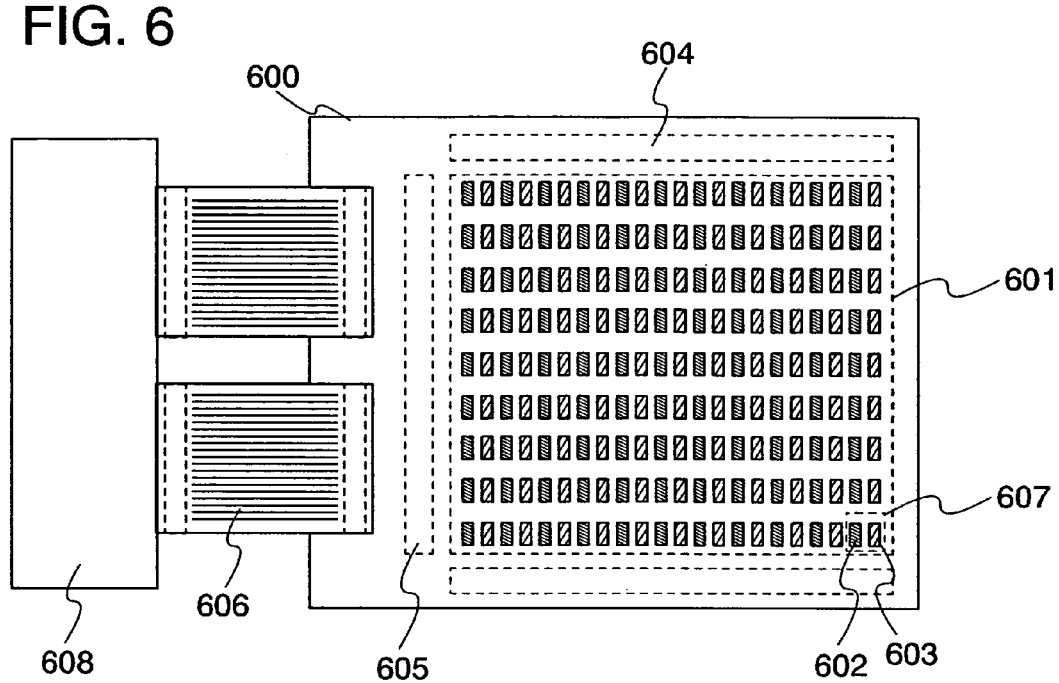
FIG. 6 is a diagram for explaining a lighting system of the present invention.

FIG. 6 shows one mode of the lighting system of the present invention. In the lighting system shown in FIG. 6, a light emitting region 601, a first circuit portion 604, and a second circuit portion 605 are provided over a substrate 600. In the light emitting region 601, the divided light emitting regions are arranged in matrix, and one divided light emitting region 607 is provided with two light emitting elements.

In FIG. 6, each light emitting element is electrically connected to both the first circuit portion 604 and the second circuit portion 605. In addition, each light emitting element is electrically connected to an IC 608 where a power supply circuit, a monitor circuit, and the like are formed, through an FPC 606.

As for a first light emitting element 602 and a second light emitting element 603, luminances thereof are independently controlled by a control means (such as a control circuit, a power supply circuit, or a monitor circuit) so as to suppress a change in emission color over time. The size of each divided light emitting region is preferably sufficiently small so that a difference between emission colors of the first light emitting element 602 and the second light emitting element 603 is unnoticeable.

Note that when divided light emitting regions are formed in matrix as described in this embodiment mode, either a passive matrix light emitting device or an active matrix light emitting device may be formed. Further, although FIG. 6 shows the lighting system in which the first circuit portion 604 and the second circuit portion 605 are formed over a substrate where the light emitting region 601 is formed, the first circuit portion and the second circuit portion may be formed on an IC and may be mounted.

The lighting system of the present invention can emit light with high luminance, causes little color shift even after being used for a long time, and has a long life.

(Embodiment Mode 9)

Figure 7:
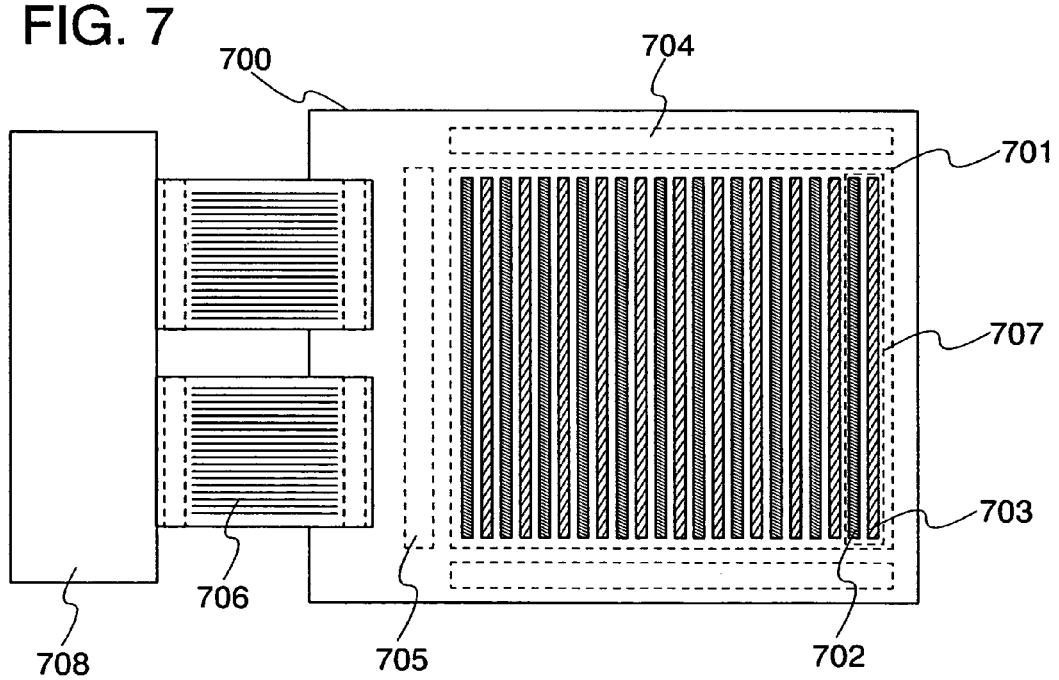
FIG. 7 is a diagram for explaining a lighting system of the present invention.
Figure 8A:
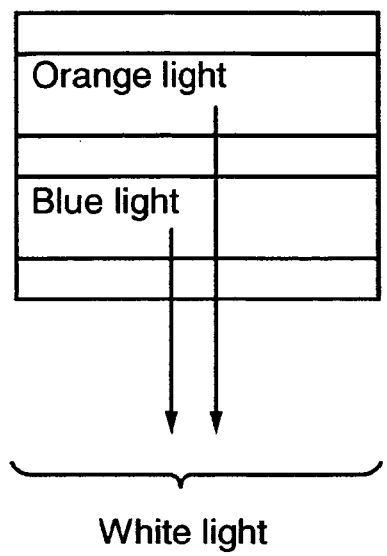
FIGS. 8A to 8C are diagrams for explaining lighting systems of the present invention.
Figure 8C:
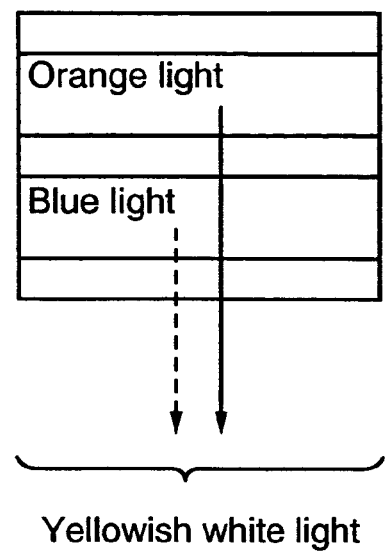
Figure 8B:
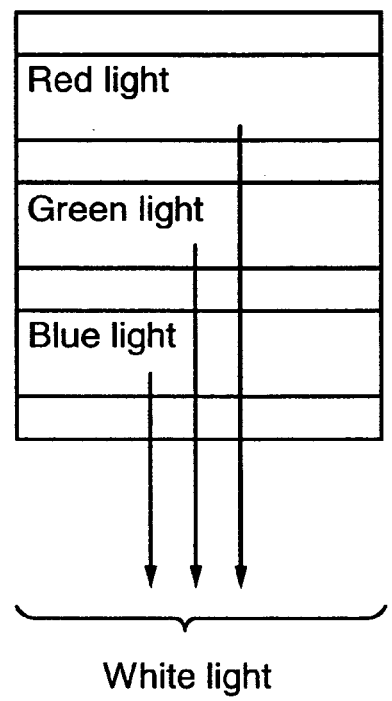

With reference to FIG. 7, this embodiment mode explains a lighting system having a structure different from that described in Embodiment Mode 8. In the lighting system of the present invention, a light emitting region is divided into a plurality of regions, and each of the divided light emitting regions includes a plurality of light emitting elements.

FIG. 7 shows one mode of the lighting system of the present invention. In the lighting system shown in FIG. 7, a light emitting region 701, a first circuit portion 704, and a second circuit portion 705 are provided over a substrate 700. In the light emitting region 701, a plurality of divided light emitting regions is arranged in stripes, and one divided light emitting region 707 includes two light emitting elements.

In FIG. 7, each light emitting element is electrically connected to both the first circuit portion 704 and the second circuit portion 705. In addition, each light emitting element is electrically connected to an IC 708 where a power supply circuit, a monitor circuit, and the like are formed, through an FPC 706.

As for a first light emitting element 702 and a second light emitting element 703, luminances thereof are independently controlled by a control means (such as a control circuit, a power supply circuit, or a monitor circuit) so as to a suppress change in emission color over time. The size of each divided light emitting region is preferably sufficiently small so that a difference between emission colors of the first light emitting element 702 and the second light emitting element 703 is unnoticeable.

The width of the divided light emitting region 707 is preferably sufficiently small so that the difference between emission colors of the first light emitting element and the second light emitting element is not recognized by human eyes. Since the divided light emitting regions are arranged linearly as shown in FIG. 7, simplification of a process and cost reduction can be achieved.

Although FIG. 7 shows the lighting system in which the first circuit portion 704 and the second circuit portion 705 are formed over a substrate where the light emitting region 701 is formed, the first circuit portion and the second circuit portion may be formed on an IC and may be mounted.

The lighting system of the present invention can emit light with high luminance, causes little color shift even after being used for a long time, and has a long life.

(Embodiment Mode 10)

This embodiment mode explains an appearance of a panel which corresponds to one mode of the lighting system of the present invention with reference to FIGS. 13A and 13B. FIG. 13A is a top view of a panel in which a thin film transistor (TFT) and a light emitting element formed over an element substrate are sealed with a sealant between the element substrate and a cover material. FIG. 13B corresponds to a cross-sectional view of FIG. 13A taken along a line A-A'.

A sealant 4005 is provided to surround a light emitting region 4002 and a gate line driver circuit 4004 which are provided over an element substrate 4001. A cover material 4006 is provided over the light emitting region 4002 and the gate line driver circuit 4004. Thus, the light emitting region 4002 and the gate line driver circuit 4004 as well as a filler 4007 are sealed with the element substrate 4001, the sealant 4005, and the cover material 4006. In addition, an IC where a source line driver circuit 4003 is formed is mounted on the element substrate 4001 in a region other than the region surrounded by the sealant 4005.

The light emitting region 4002 and the gate line driver circuit 4004 which are provided over the element substrate 4001 include a plurality of TFTs. FIG. 13B shows a TFT 4010 included in the light emitting region 4002 as an example. The TFT 4010 is formed using an amorphous semiconductor, and a source region or a drain region of the TFT 4010 is electrically connected to a light emitting element 4011.

In addition, various signals and potentials supplied to the source line driver circuit 4003 which is formed separately and the gate line driver circuit 4004 or the light emitting region 4002 are supplied from a connection terminal 4016 through lead wires 4014 and 4015. The connection terminal 4016 and the lead wires 4014 and 4015 can be formed by various methods.

The connection terminal 4016 is electrically connected to a terminal included in a flexible printed circuit (FPC) 4018 through an anisotropic conductive film 4019.

Note that glass, metal (typically, stainless steel), ceramic, or plastic can be used as the element substrate 4001 and the cover material 4006. As for plastic, an FRP (Fiberglass-Reinforced Plastics) plate, a PVF (polyvinyl fluoride) film, a mylar film, a polyester film, or an acrylic resin film can be used. In addition, a sheet with a structure in which an aluminum foil is sandwiched between PVF films or mylar films can be used.

Note that a cover material located in an extraction direction of light from the light emitting element 4011 needs to be transparent. In that case, a light transmitting material such as a glass plate, a plastic plate, a polyester film, or an acrylic film is used.

An ultraviolet curing resin or a thermosetting resin as well as an inert gas such as nitrogen or argon can be used as the filler 4007. PVC (polyvinyl chloride), acrylic, polyimide, an epoxy resin, a silicon resin, PVB (polyvinyl butyral), or EVA (ethylene vinyl acetate) can be used. In addition, an inert liquid such as carbon fluoride may be used.

In order to expose the filler 4007 to a hygroscopic substance (preferably, barium oxide) or a substance capable of adsorbing oxygen, a hygroscopic substance or a substance capable of adsorbing oxygen as well as the filler 4007 may be provided between the cover material 4006 and the element substrate 4001. By providing the hygroscopic substance or the substance capable of adsorbing oxygen, deterioration of the light emitting element 4011 can be suppressed.

Note that FIGS. 13A and 13B show the mode in which the source line driver circuit 4003 is formed separately and mounted on the element substrate 4001, but the present invention is not limited to this structure. The gate line driver circuit may be separately formed and then mounted, or only a part of the source line driver circuit or the gate line driver circuit may be separately formed and then mounted. Alternatively, all of the source line driver circuit, the gate line driver circuit, a controller, a power supply circuit, a monitor circuit, and the like may be formed on an IC and then mounted.

Further, this embodiment mode describes the lighting system which includes a TFT using an amorphous semiconductor as one mode. However, when using a crystalline semiconductor, the source line driver circuit, the gate line driver circuit, and the like may be formed over the same substrate as that provided with TFTs of a light emitting region. In addition, a large-area lighting system may be manufactured by attaching a peeled panel.

Note that a transistor used for the lighting system of the present invention may use either an organic semiconductor or an inorganic semiconductor. Alternatively, it may use an amorphous semiconductor, a microcrystalline semiconductor, a crystalline semiconductor, or the like.

(Embodiment Mode 11)

This embodiment mode explains modes of devices using the lighting system of the present invention with reference to FIGS. 9 and 10A to 10C.

Figure 9:
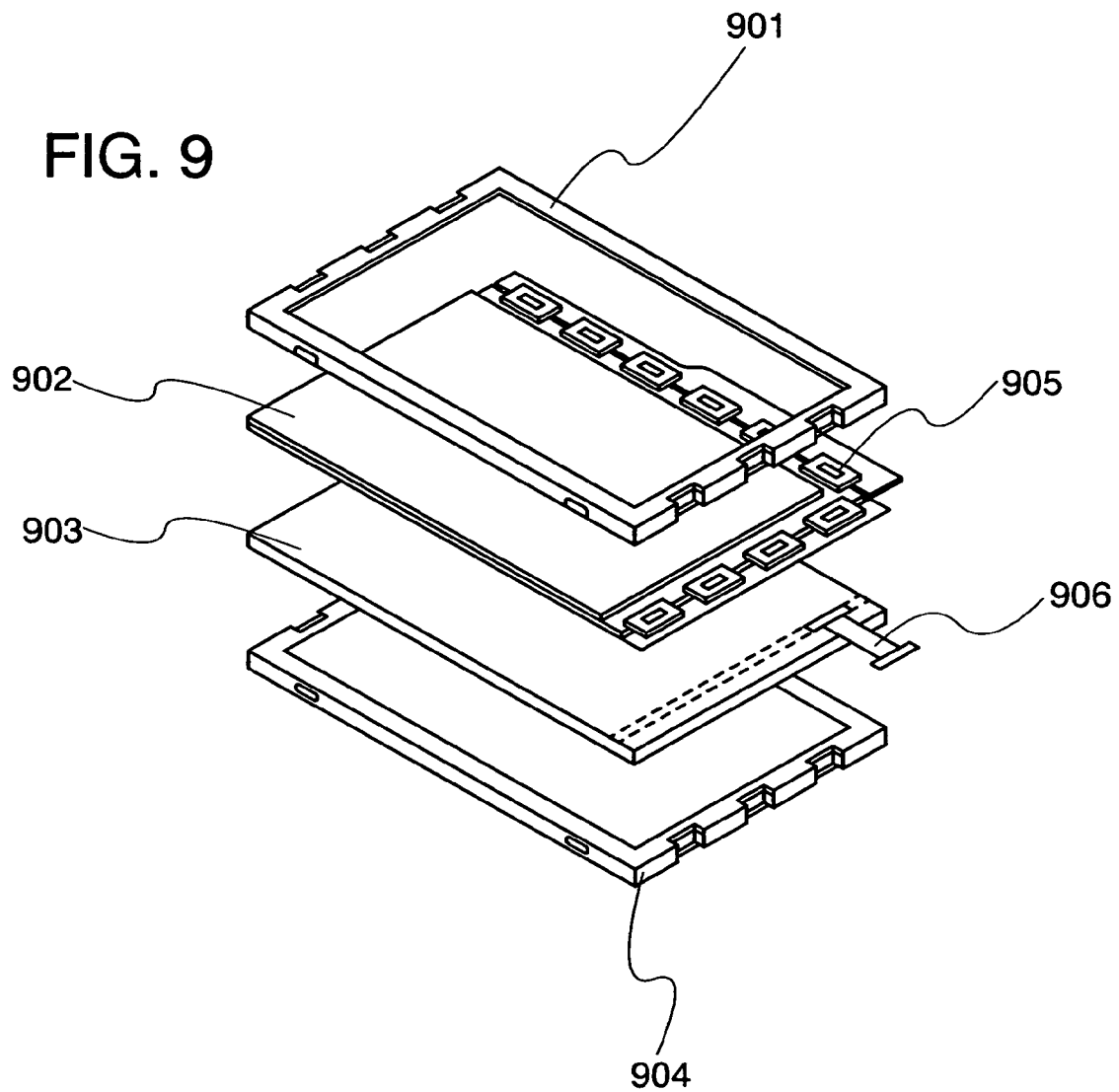
FIG. 9 is a diagram for explaining a lighting system of the present invention.

FIG. 9 shows an example of a liquid crystal display device using the lighting system of the present invention as a backlight. The liquid crystal display device shown in FIG. 9 includes a chassis 901, a liquid crystal layer 902, a backlight 903, and a chassis 904. The liquid crystal layer 902 is connected to a driver IC 905. The lighting system of the present invention is used as the backlight 903, to which a current is supplied through a terminal 906.

By using the lighting system of the present invention as a backlight of a liquid crystal display device, a backlight with high luminance and long life can be obtained, which improves quality as a display device. Since the lighting system of the present invention is a plane-emission lighting system and can be formed to have a large area, a larger-area backlight can be obtained and a larger-area liquid crystal display device can also be obtained. Furthermore, a light emitting element is thin and consumes less power; therefore, reductions in thickness and power consumption of the display device can also be achieved.

Figure 10A:
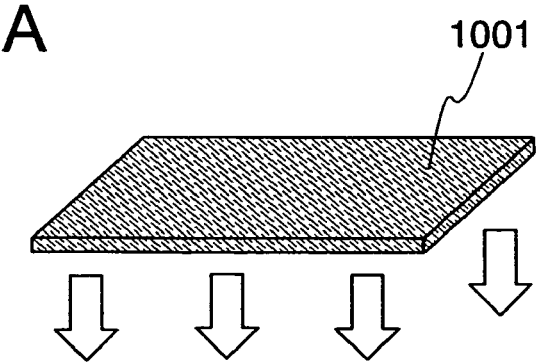
FIGS. 10A to 10C are diagrams for explaining lighting systems of the present invention.

FIG. 10A shows the lighting system of the present invention used as indoor lighting. Since the lighting system of the present invention has high luminance, the lighting system can light a room more brightly. In addition, since the lighting system of the present invention has a long life, the frequency of replacing lighting systems can be decreased. The lighting system of the present invention is a plane-emission lighting system and can be formed to have a large area. Therefore, for example, an entire ceiling can be provided with the lighting system of the present invention. Not only the ceiling but also a wall, a floor, a column, or the like can be provided with the lighting system of the present invention. Furthermore, by manufacturing the lighting system of the present invention using a flexible substrate, a thin and flexible lighting system can be obtained. Thus, the lighting system of the present invention can also be provided over a curved surface. Moreover, the lighting system can be used not only indoors but also outdoors and can be provided on a building wall or the like as an outdoor light.

Figure 10B:
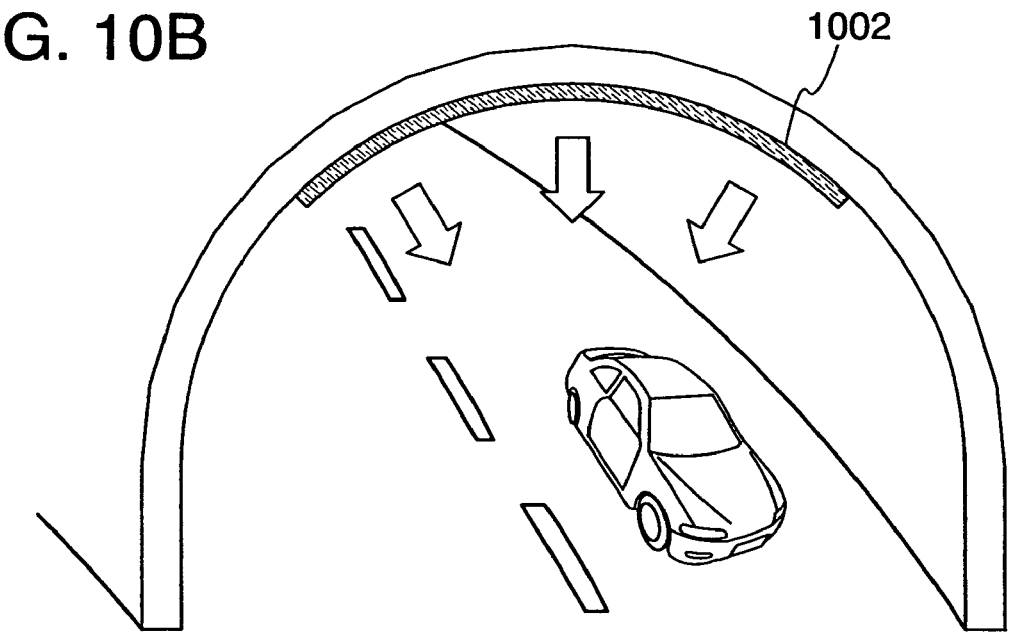

FIG. 10B shows the lighting system of the present invention used as lighting in a tunnel. Since the lighting system of the present invention has high luminance, it can light the inside of a tunnel more brightly. In addition, since the lighting system of the present invention has a long life, the frequency of replacing lighting systems can be decreased and maintenance cost can be reduced. Furthermore, by manufacturing the lighting system of the present invention using a flexible substrate, a thin and flexible lighting system can be obtained. Therefore, the lighting system of the present invention can be formed along a curved inner wall of a tunnel.

Figure 10C:
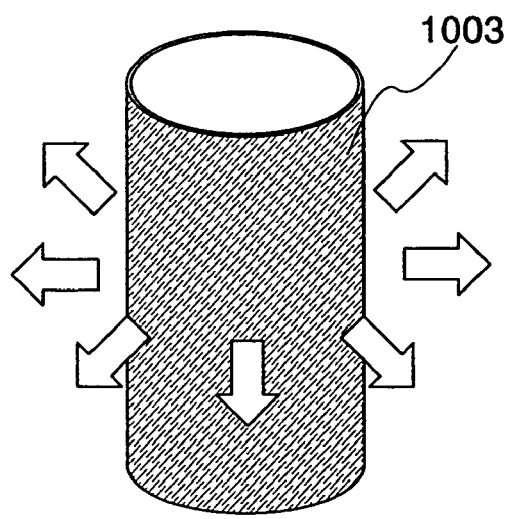

FIG. 10C shows an example of the lighting system of the present invention used as interior lighting. Since the lighting system of the present invention has high luminance, it can light a space around it more brightly. In addition, since the lighting system of the present invention has a long life, the frequency of replacing lighting systems can be decreased. Furthermore, by manufacturing the lighting system of the present invention using a flexible substrate, a thin and flexible lighting system can be obtained. Since the lighting system of the present invention is of a plane-emission type, it can be processed into a desired shape as shown in FIG. 10C.

The lighting system of the present invention can also be used as lighting in taking a picture. In the case of taking a picture, a picture similar to one which is taken with a subject illuminated by natural light can be taken when a subject is illuminated by large-area light with high luminance.

Figure 11A:
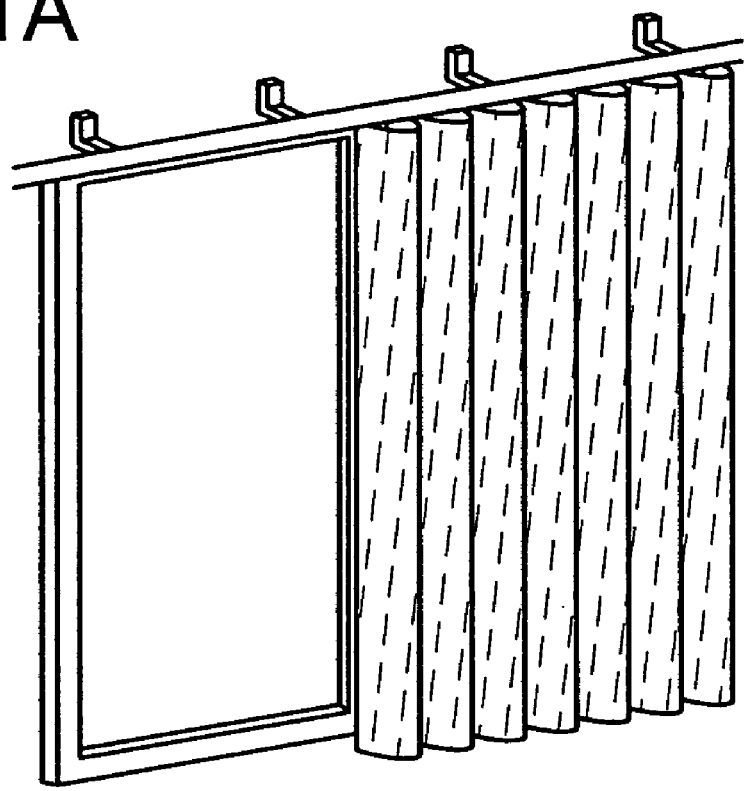
FIGS. 11A and 11B are diagrams for explaining lighting systems of the present invention.

FIG. 11A shows a curtain-shaped lighting system. By manufacturing the lighting system of the present invention using a flexible substrate, a thin and flexible lighting system can be obtained. In the day time, outside light can be let into a room by tying the curtain-shaped lighting system, and at night, the room can be lit by spreading the curtain-shaped lighting system, similarly to the case of letting in outside light. Since the lighting system of the present invention has high luminance, it can light a room more brightly. In addition, since the lighting system of the present invention has a long life, the frequency of replacing lighting systems can be decreased.

Figure 11B:
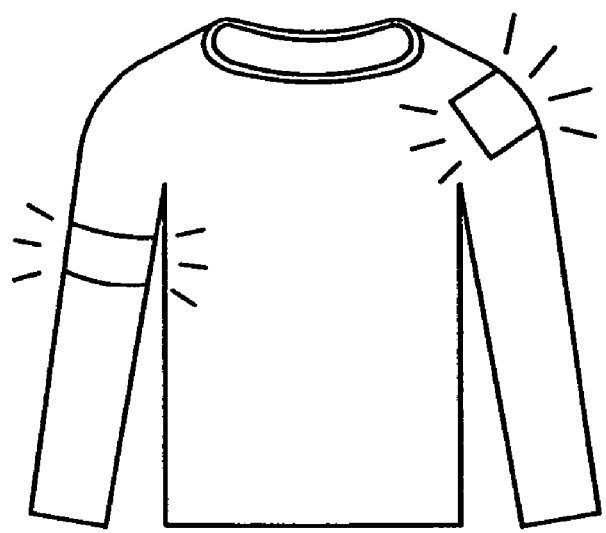

FIG. 11B shows clothing using the lighting system of the present invention in part thereof. By manufacturing the lighting system of the present invention using a flexible substrate, a thin and flexible lighting system can be obtained. As a power source, a solar battery may be used, or a battery may be mounted. By wearing the clothing using the lighting system of the present invention in part thereof such as when walking outside at night, the clothing enables people therearound to recognize the presence of a wearer. Thus, a traffic accident and the like can be prevented. Note that the lighting system of the present invention can be used for clothing goods such as a bag and a hat, and the like as well as clothing. Since the lighting system of the present invention has high luminance, it enables a person far away to recognize the presence of a wearer. In addition, since the lighting system of the present invention has a long life, the frequency of replacing lighting systems can be decreased.

This application is based on Japanese Patent Application serial no. 2005-301837 filed in Japan Patent Office on Oct. 17, 2005, the contents of which are hereby incorporated by reference.

What is claimed is:

1. A lighting system comprising:
a first light emitting element including:
a plurality of light emitting units formed between a first pair of electrodes; and
a charge generation layer formed between the plurality of light emitting units, wherein the plurality of light emitting units have different emission colors from each other and are electrically connected in series through the charge generation layer;
a second light emitting element comprising a light emitting unit between a second pair of electrodes, wherein emission color of the second light emitting element is substantially the same as emission color of one of the plurality of light emitting units which has the shortest lifetime among the plurality of light emitting units; and
a control circuit,
wherein the control circuit is arranged to suppress a change in total luminance of the first light emitting element and the second light emitting element by intensifying a luminance of the second light emitting element in accordance with a change in luminance of the first light emitting element.

2. A lighting system according to claim 1,
wherein the number of the light emitting units in the second light emitting element is 1.

3. A lighting system according to claim 1,
wherein the number of the light emitting units in the second light emitting element is larger than 1.

4. A lighting system according to claim 1,
wherein the first light emitting element and the second light emitting element are adjacent to each other.

5. A lighting system according to claim 1,
wherein the second light emitting element has a light emitting material, and
wherein the light emitting material is included in one of the plurality of light emitting units which has the shortest lifetime among the plurality of light emitting units.

6. A lighting system according to claim 1,
wherein the first light emitting element is arranged to emit white light.

7. A lighting system according to claim 1,
wherein the second light emitting element emits blue light.

8. A driving method of a lighting system comprising the steps of:
emitting light having a first color from a first light emitting element including:
a plurality of light emitting units formed between a first pair of electrodes; and a charge generation layer formed between the plurality of light emitting units and being capable of electrically connecting the plurality of light emitting units to each other;

emitting light having a second color from a second light emitting element comprising a light emitting unit between a second pair of electrodes, wherein the first color is different from the second color; and intensifying the light of the second light emitting element by a control unit in accordance with a change in luminance of the first light emitting element, allowing total luminance of the first light emitting element and the second light emitting element to be constant, wherein the plurality of light emitting units have different emission colors from each other, and wherein emission color of one of the plurality of light emitting units, which has the shortest lifetime among the plurality of light emitting units, is substantially the same as the second color.

9. A driving method of a lighting system according to claim 8,
wherein the number of the light emitting units in the second light emitting element is 1.

10. A driving method of a lighting system according to claim 8,
wherein the number of the light emitting units in the second light emitting element is larger than 1.

11. A driving method of a lighting system according to claim 8,
wherein the first light emitting element and the second light emitting element are adjacent to each other.

12. A driving method of a lighting system according to claim 8,
wherein the second light emitting element has a light emitting material, and
wherein the light emitting material is included in one of the plurality of light emitting units which has the shortest lifetime among the plurality of light emitting units.

13. A driving method of a lighting system according to claim 8,
wherein the first light emitting element is arranged to emit white light.

14. A driving method of a lighting system according to claim 8,
wherein the second light emitting element emits blue light.

15. A lighting system comprising:
a first light emitting element including:
a plurality of light emitting units formed between a first pair of electrodes; and
a charge generation layer formed between the plurality of light emitting units, wherein the plurality of light emitting units have different emission colors from each other and are electrically connected in series through the charge generation layer; and
a second light emitting element comprising a light emitting unit between a second pair of electrodes, and
wherein emission color of the second light emitting element is substantially the same as emission color of one of the plurality of light emitting units which has the shortest lifetime among the plurality of light emitting units.

16. A lighting system according to claim 15,
wherein the first light emitting element and the second light emitting element are adjacent to each other.

17. A lighting system according to claim 15,
wherein the first light emitting element is arranged to emit white light.

18. A lighting system according to claim 15,
wherein the second light emitting element emits blue light.

19. A lighting system according to claim 15, comprising:
a light emitting region comprising a first region and a second region which are horizontally divided with respect to a substrate, the first light emitting element is provided in the first region, and the second light emitting element is provided in the second region.

20. A lighting system according to claim 15,
wherein the number of the light emitting units in the second light emitting element is 1.

* * * * *